(12) United States Patent
Kobayashi et al.

(10) Patent No.: US 9,786,522 B2
(45) Date of Patent: Oct. 10, 2017

(54) SUBSTRATE TREATMENT METHOD AND SUBSTRATE TREATMENT APPARATUS

(71) Applicant: SCREEN Holdings Co., Ltd., Kyoto (JP)

(72) Inventors: Kenji Kobayashi, Kyoto (JP); Manabu Okutani, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 182 days.

(21) Appl. No.: 14/659,701

(22) Filed: Mar. 17, 2015

(65) Prior Publication Data

US 2015/0258553 A1   Sep. 17, 2015

(30) Foreign Application Priority Data

Mar. 17, 2014   (JP) .................. 2014-053683

(51) Int. Cl.
| | |
|---|---|
| B05B 1/24 | (2006.01) |
| H01L 21/67 | (2006.01) |
| B05C 11/08 | (2006.01) |
| B05D 1/02 | (2006.01) |
| B05B 15/06 | (2006.01) |
| H01L 21/687 | (2006.01) |

(52) U.S. Cl.
CPC .......... *H01L 21/67028* (2013.01); *B05B 1/24* (2013.01); *B05B 15/06* (2013.01); *B05C 11/08* (2013.01); *B05D 1/02* (2013.01); *H01L 21/67051* (2013.01); *H01L 21/67109* (2013.01); *H01L 21/67201* (2013.01); *H01L 21/6875* (2013.01); *H01L 21/68728* (2013.01); *H01L 21/68742* (2013.01)

(58) Field of Classification Search
None
See application file for complete search history.

(56) References Cited

U.S. PATENT DOCUMENTS

| | | | |
|---|---|---|---|
| 2004/0144322 A1 | 7/2004 | Kuibira et al. | 118/728 |
| 2007/0045271 A1 | 3/2007 | Kimura et al. | 219/216 |
| 2011/0155177 A1 | 6/2011 | Tamura et al. | 134/18 |
| 2015/0013732 A1 | 1/2015 | Negoro et al. | 134/57 |

(Continued)

FOREIGN PATENT DOCUMENTS

| | | |
|---|---|---|
| CN | 1740385 A | 3/2006 |
| CN | 102013408 A | 4/2011 |

(Continued)

*Primary Examiner* — Erma Cameron
(74) *Attorney, Agent, or Firm* — Ostrolenk Faber LLP

(57) ABSTRACT

A substrate treatment method is performed by a substrate treatment apparatus including a substrate holding unit which holds a substrate, and a hot plate which heats the substrate from below. The method includes: a treatment liquid supplying step of locating the hot plate at a retracted position at which the hot plate is retracted below the substrate holding unit and, in this state, supplying a treatment liquid to an upper surface of the substrate held by the substrate holding unit; a protection liquid film forming step of forming a liquid film of a protection liquid to cover an upper surface of the hot plate in the treatment liquid supplying step; and a substrate heating step of heating the substrate by the hot plate with the hot plate being located adjacent to a lower surface of the substrate or in contact with the lower surface of the substrate.

5 Claims, 15 Drawing Sheets

(56) References Cited

U.S. PATENT DOCUMENTS

| | | | |
|---|---|---|---|
| 2015/0047677 A1 | 2/2015 | Muramoto | 134/19 |
| 2015/0243542 A1* | 8/2015 | Yoshihara | H01L 21/68764 156/345.15 |
| 2015/0270146 A1* | 9/2015 | Yoshihara | H01L 21/67028 134/18 |
| 2015/0279708 A1* | 10/2015 | Kobayashi | C23C 16/458 438/747 |

FOREIGN PATENT DOCUMENTS

| | | |
|---|---|---|
| CN | 102099900 A | 6/2011 |
| CN | 103295936 A | 9/2013 |
| JP | H11-102884 A | 4/1999 |
| JP | 2004-259734 A | 9/2004 |
| JP | 2007-73492 A | 3/2007 |
| JP | 2008-004879 | 1/2008 |
| KR | 10-2010-0127010 A | 12/2010 |
| WO | WO 2013/140955 A1 | 9/2013 |

\* cited by examiner

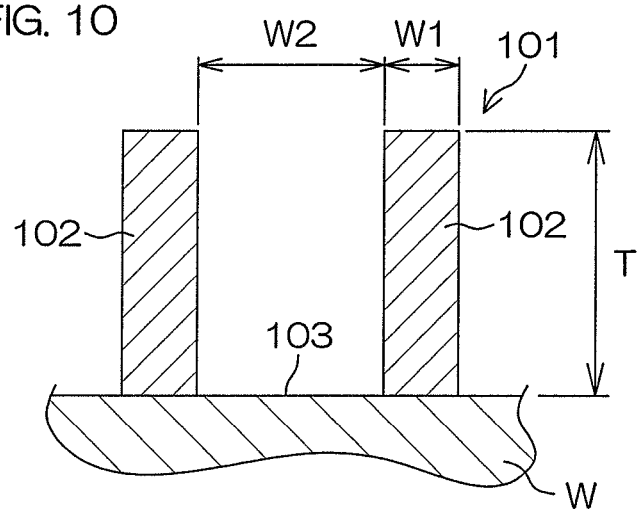

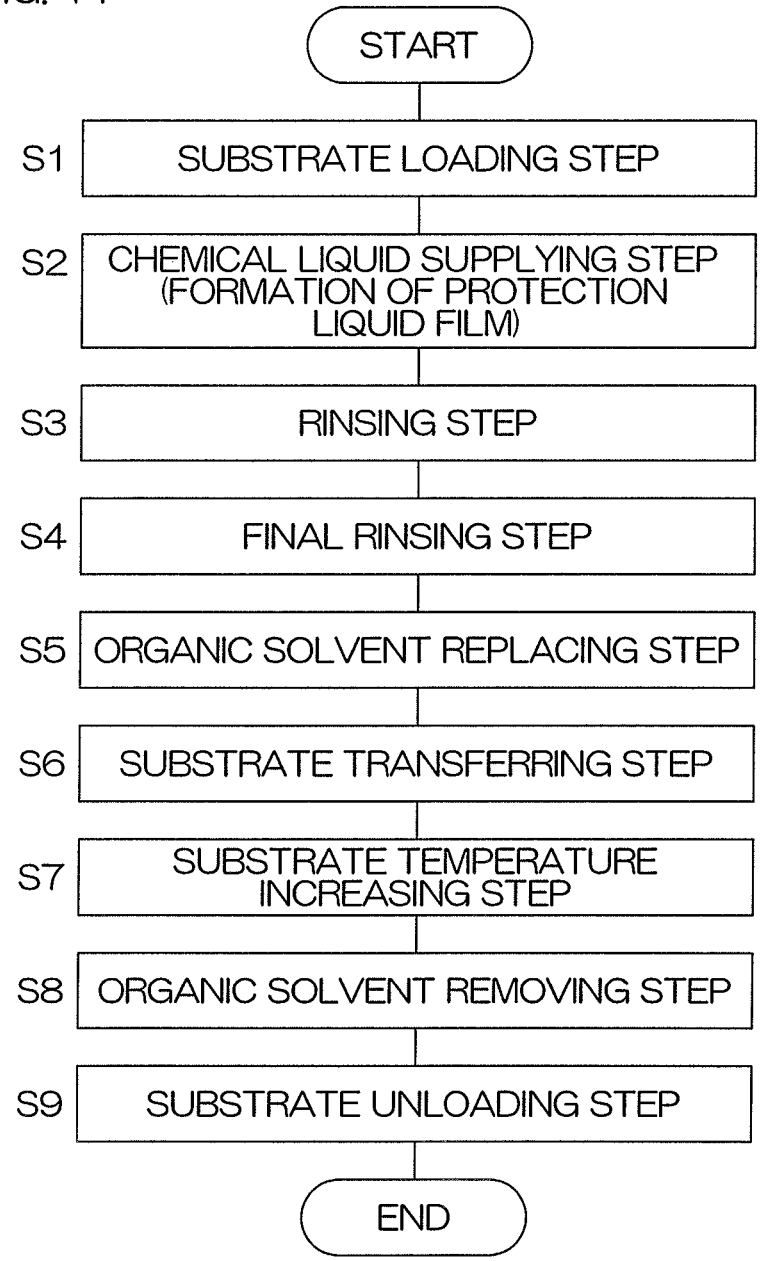

SUBSTRATE TREATMENT METHOD AND SUBSTRATE TREATMENT APPARATUS

BACKGROUND OF THE INVENTION

1. Field of the Invention

The present invention relates to a substrate treatment method and a substrate treatment apparatus for treating a substrate such as a semiconductor wafer, a glass substrate for a liquid crystal display device, a substrate for a plasma display, a substrate for an FED (Field Emission Display), a substrate for an optical disk, a substrate for a magnetic disk, a substrate for a magneto-optical disk, a substrate for a photo mask, a ceramic substrate or a substrate for a solar cell.

2. Description of Related Art

In production processes for a semiconductor device and a liquid crystal display device, a substrate such as a semiconductor wafer or a glass substrate for a liquid crystal display panel is subjected to a chemical liquid treatment in which a chemical liquid is supplied to a surface of the substrate to clean the substrate surface with the chemical liquid, and a higher-temperature treatment in which the substrate is heated.

A substrate treatment apparatus of a single substrate treatment type adapted to treat a single substrate at a time for cleaning the substrate, for example, includes a substrate holding and rotating unit which generally horizontally holds the substrate and rotates the substrate, and a chemical liquid nozzle which supplies the chemical liquid to the surface of the substrate rotated by the substrate holding and rotating unit.

A known substrate treatment apparatus of the single substrate treatment type includes a heater incorporated in a rotary base of the substrate holding and rotating unit (see JP2008-4879A). In this case, the substrate held by the substrate holding and rotating unit is heated to a higher temperature by the rotary base.

SUMMARY OF THE INVENTION

The inventor of the present invention contemplates that a hot plate incorporating the heater is provided separately from the substrate holding and rotating unit, and the hot plate and the substrate holding unit are adapted to be relatively moved up and down with respect to each other. More specifically, the substrate is heated by the hot plate with an upper surface of the hot plate being located adjacent to a lower surface of the substrate during the higher-temperature treatment. During the chemical liquid treatment, on the other hand, the hot plate is retracted below the substrate holding unit to reduce a heat transfer amount from the hot plate and, in this state, the chemical liquid is supplied to the substrate.

In the chemical liquid supplying step (during the chemical liquid treatment), however, liquid droplets of the chemical liquid expelled from the substrate held by the substrate holding unit are liable to fall over the upper surface of the hot plate retracted below the substrate holding unit.

When the chemical liquid droplets are supplied directly onto the upper surface of the hot plate, the chemical liquid is heated by the heat-generating hot plate to be thereby thermally dried on the upper surface of the hot plate. The chemical liquid thermally dried on the upper surface of the hot plate is liable to scatter in the form of particles in an atmosphere to contaminate the substrate.

It is therefore an object of the present invention to provide a substrate treatment method which reliably protects the upper surface of the hot plate from the chemical liquid in the chemical liquid supplying step, thereby preventing generation of the particles which may otherwise occur when the chemical liquid is dried on the hot plate.

It is another object of the present invention to provide a substrate treatment apparatus which has a simplified arrangement for properly forming a liquid film of a protection liquid on the upper surface of the hot plate by spouting the protection liquid from a protection liquid outlet port.

The present invention provides a substrate treatment method to be performed by a substrate treatment apparatus including a substrate holding unit which holds a substrate, and a hot plate which heats the substrate from below, the substrate treatment method including: a treatment liquid supplying step of locating the hot plate at a retracted position at which the hot plate is retracted below the substrate holding unit and, in this state, supplying a treatment liquid to an upper surface of the substrate held by the substrate holding unit; a protection liquid film forming step of forming a liquid film of a protection liquid on an upper surface of the hot plate to cover the upper surface of the hot plate in the treatment liquid supplying step; and a substrate heating step of heating the substrate by the hot plate with the hot plate being located adjacent to a lower surface of the substrate or in contact with the lower surface of the substrate.

According to this method, the protection liquid film is formed on the upper surface of the hot plate to cover the upper surface of the hot plate in the treatment liquid supplying step. In the treatment liquid supplying step, the hot plate is retracted below the substrate holding unit. Therefore, liquid droplets of the treatment liquid expelled from the substrate held by the substrate holding unit are liable to fall over the upper surface of the hot plate.

Even in this case, however, the upper surface of the hot plate is covered with the protection liquid film, so that the treatment liquid droplets are not supplied directly onto the upper surface of the hot plate from the substrate. Therefore, the treatment liquid is reliably prevented from being dried on the upper surface of the hot plate when the hot plate is energized in a heat-generating state. This prevents the generation of particles which may otherwise occur when the treatment liquid is dried on the hot plate.

According to one embodiment of the present invention, the protection liquid film forming step includes the step of continuously supplying the protection liquid to the upper surface of the hot plate.

According to this method, the protection liquid is continuously supplied to the upper surface of the hot plate, whereby the upper surface of the hot plate can be covered with the protection liquid film in the treatment liquid supplying step.

The protection liquid film forming step preferably includes the step of spouting the protection liquid from a protection liquid outlet port provided in the upper surface of the hot plate. In this case, the protection liquid can be supplied to the upper surface of the hot plate without the need for separately providing a protection liquid spouting nozzle.

The protection liquid film forming step may include the step of spouting the protection liquid to the upper surface of the hot plate from a protection liquid nozzle.

The treatment liquid supplying step may include the steps of supplying a chemical liquid or a rinse liquid to the upper surface of the substrate, and supplying an organic solvent to the upper surface of the substrate to replace the chemical liquid or the rinse liquid with a liquid film of the organic solvent on the upper surface of the substrate, and the organic solvent liquid film formed on the upper surface of the substrate in the organic solvent supplying step is heated on the upper surface of the substrate in the substrate heating step. In this case, it is possible to prevent generation of particles which may otherwise occur when the chemical liquid or the rinse liquid is dried on the hot plate, thereby preventing the substrate from being contaminated with the particles in the subsequent step of heating the organic solvent liquid film on the upper surface of the substrate.

The present invention further provides a substrate treatment apparatus, which includes: a substrate holding unit which horizontally holds a substrate; a treatment liquid supplying unit which supplies a treatment liquid toward an upper surface of the substrate held by the substrate holding unit; a hot plate which heats the substrate from below while being located adjacent to a lower surface of the substrate or in contact with the lower surface of the substrate; and a protection liquid supplying unit which supplies a protection liquid to an upper surface of the hotplate to form a liquid film of the protection liquid on the upper surface of the hot plate when the treatment liquid is supplied by the treatment liquid supplying unit.

With this arrangement, the protection liquid film is formed on the upper surface of the hot plate during the supply of the treatment liquid. Therefore, the treatment liquid is reliably prevented from being dried on the upper surface of the hot plate when the hot plate is energized in a heat generating state. This prevents generation of particles which may otherwise occur when the treatment liquid is dried on the hot plate.

According to one embodiment of the present invention, the hot plate includes: a protection liquid outlet port which opens in the upper surface of the hot plate; a protection liquid flow passage through which the protection liquid to be supplied to the protection liquid outlet port flows, the protection liquid flow passage communicating with the protection liquid outlet port; a protection liquid pipe fixedly provided in the hot plate to define the protection liquid outlet port and the protection liquid flow passage; and a closing member provided in a vertically movable manner in the protection liquid flow passage and capable of closing the protection liquid outlet port. The closing member is located at a closing position at which the closing member closes the protection liquid outlet port when the protection liquid is not to be spouted from the protection liquid outlet port, and located at an elevated position at which the closing member is located above the upper surface of the hot plate when the protection liquid is to be spouted from the protection liquid outlet port. The closing member guides the protection liquid spouted from the protection liquid outlet port toward an outer peripheral portion of the hot plate when being located at the elevated position.

With this arrangement, the closing member closes the protection liquid outlet port when the protection liquid is not to be spouted from the protection liquid outlet port. When the protection liquid is to be spouted from the protection liquid outlet port, on the other hand, the closing member is elevated above the upper surface of the hot plate. In this state, the closing member guides the protection liquid spouted from the protection liquid outlet port toward the outer peripheral portion of the hot plate. This promotes the formation of the protection liquid film on the upper surface of the hot plate.

With this simple arrangement, the protection liquid outlet port of the hot plate can be closed when the protection liquid is not to be spouted from the protection liquid outlet port, and the protection liquid film can be properly formed on the upper surface of the hot plate when the protection liquid is spouted from the protection liquid outlet port.

In this case, the closing member may be provided in a vertically movable manner in the protection liquid flow passage, and adapted to receive a pressure from the protection liquid flowing through the protection liquid flow passage to be thereby located at the elevated position. With this arrangement, the protection liquid does not flow through the protection liquid flow passage when the protection liquid is not spouted from the protection liquid outlet port. At this time, the closing member closes the protection liquid outlet port. When the protection liquid is spouted from the protection liquid outlet port, on the other hand, the protection liquid flows through the protection liquid flow passage, and the closing member receives the pressure from the flowing protection liquid to be thereby elevated above the upper surface of the hot plate. This eliminates the need for separately providing a driving member for moving up and down the closing member.

The upper surface of the closing member may be flush with the upper surface of the hot plate or retracted below the upper surface of the hot plate, when the closing member is located at the closing position.

With this arrangement, the upper surface of the closing member is flush with the upper surface of the hot plate or retracted below the upper surface of the hot plate when the protection liquid is not to be spouted from the protection liquid outlet port. Therefore, the substrate placed on the hot plate can be properly supported in contact with the entire upper surface of the hot plate, and the entire substrate can be properly heated.

The treatment liquid supplying unit includes a first treatment liquid supplying unit which supplies a first treatment liquid including a chemical liquid or a rinse liquid toward the substrate, and a second treatment liquid supplying unit which supplies a second treatment liquid including an organic solvent toward the substrate to form a liquid film of the second treatment liquid on the upper surface of the substrate. The hot plate may heat the substrate with the second treatment liquid film being formed on the upper surface of the substrate.

With this arrangement, generation of particles can be prevented which may otherwise occur when the first and/or second treatment liquids are dried on the upper surface of the hot plate. Therefore, contamination of the substrate with the particles can be reduced in the step of heating the liquid film of the second treatment liquid including the organic solvent on the upper surface of the substrate.

The foregoing and other objects, features and effects of the present invention will become more apparent from the following detailed description of the preferred embodiments with reference to the attached drawings.

BRIEF DESCRIPTION OF THE DRAWINGS

FIG. 10 is a sectional view showing a surface of a substrate to be treated by a treatment unit on an enlarged scale.

FIG. 11 is a process diagram for explaining an exemplary chemical liquid treatment process to be performed by the treatment unit.

DETAILED DESCRIPTION OF PREFERRED EMBODIMENTS

Figure 1:
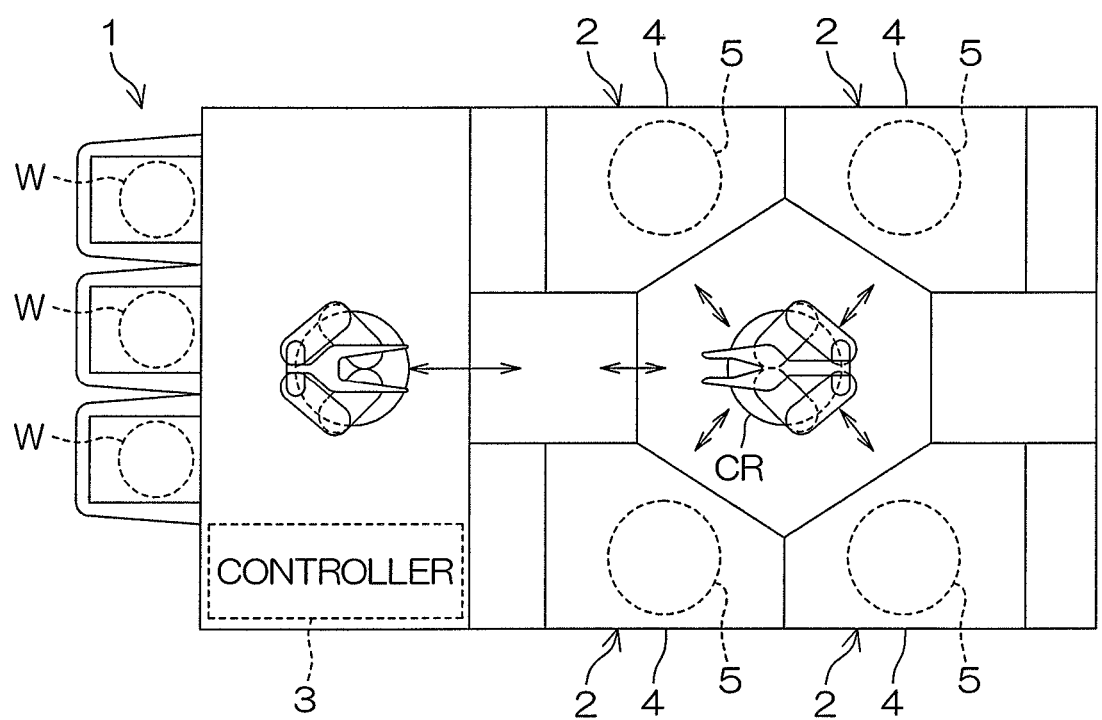
FIG. 1 is a schematic plan view showing the construction of a substrate treatment apparatus according to one embodiment of the present invention.
Figure 2:
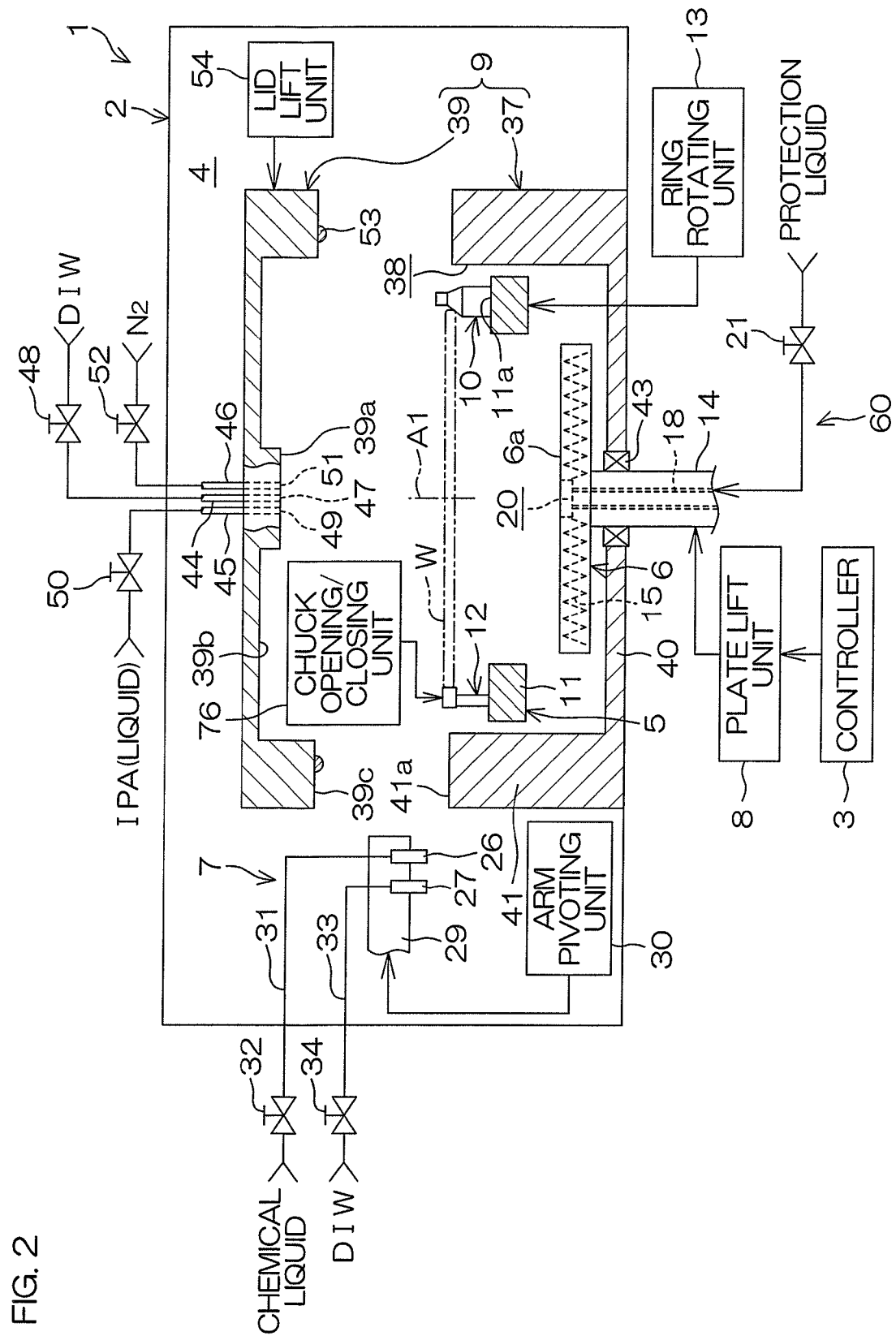
FIG. 2 is a sectional view showing the inside of a chamber provided in the substrate treatment apparatus shown in FIG. 1.

FIG. 1 is a schematic plan view showing a substrate treatment apparatus 1 according to one embodiment of the present invention. FIG. 2 is a sectional view showing the inside of a chamber 4 provided in the substrate treatment apparatus 1.

As shown in FIG. 1, the substrate treatment apparatus 1 is of a single substrate treatment type adapted to treat a single disk-shaped substrate W (e.g., semiconductor wafer) at a time. The substrate treatment apparatus 1 includes a plurality of treatment units 2 which are each adapted to treat a substrate W with a treatment liquid or a treatment gas, a substrate transport robot CR which loads and unloads a substrate W with respect to a chamber 4 of each of the treatment units 2, and a controller 3 which controls the operations of devices provided in the substrate treatment apparatus 1 and the opening and closing of valves.

The treatment units 2 are of a single substrate treatment type adapted to treat a front surface (pattern formation surface) of the round substrate W with a chemical liquid for a chemical liquid treatment. The treatment units 2 each include a box-shaped chamber 4 having an inside space, a substrate holding and rotating unit (substrate holding unit) 5 which, while horizontally holding a single substrate W in the chamber 4, rotates the substrate W about a vertical rotation axis A1 extending through the center of the substrate W, a hot plate 6 which has a substrate opposing surface (upper surface) 6a for heating the substrate W from below and supports the substrate W from below in contact with a lower surface of the substrate W, a treatment liquid supplying unit (first treatment supplying unit) 7 which supplies a treatment liquid such as the chemical liquid, a rinse liquid and the like to the substrate W held by the substrate holding and rotating unit 5, a plate lift unit 8 which moves up and down the hot plate 6, a lower supplying unit (protection liquid supplying unit) 60 which supplies a protection liquid to the substrate opposing surface 6a of the hot plate 6, and a cup 9 which is capable of accommodating the substrate holding and rotating unit 5 and the hot plate 6 in a sealed state. The lower supplying unit 6 includes a protection liquid pipe 18, a protection liquid valve 21 which opens and closes the protection liquid pipe 18, and the like.

Figure 3:
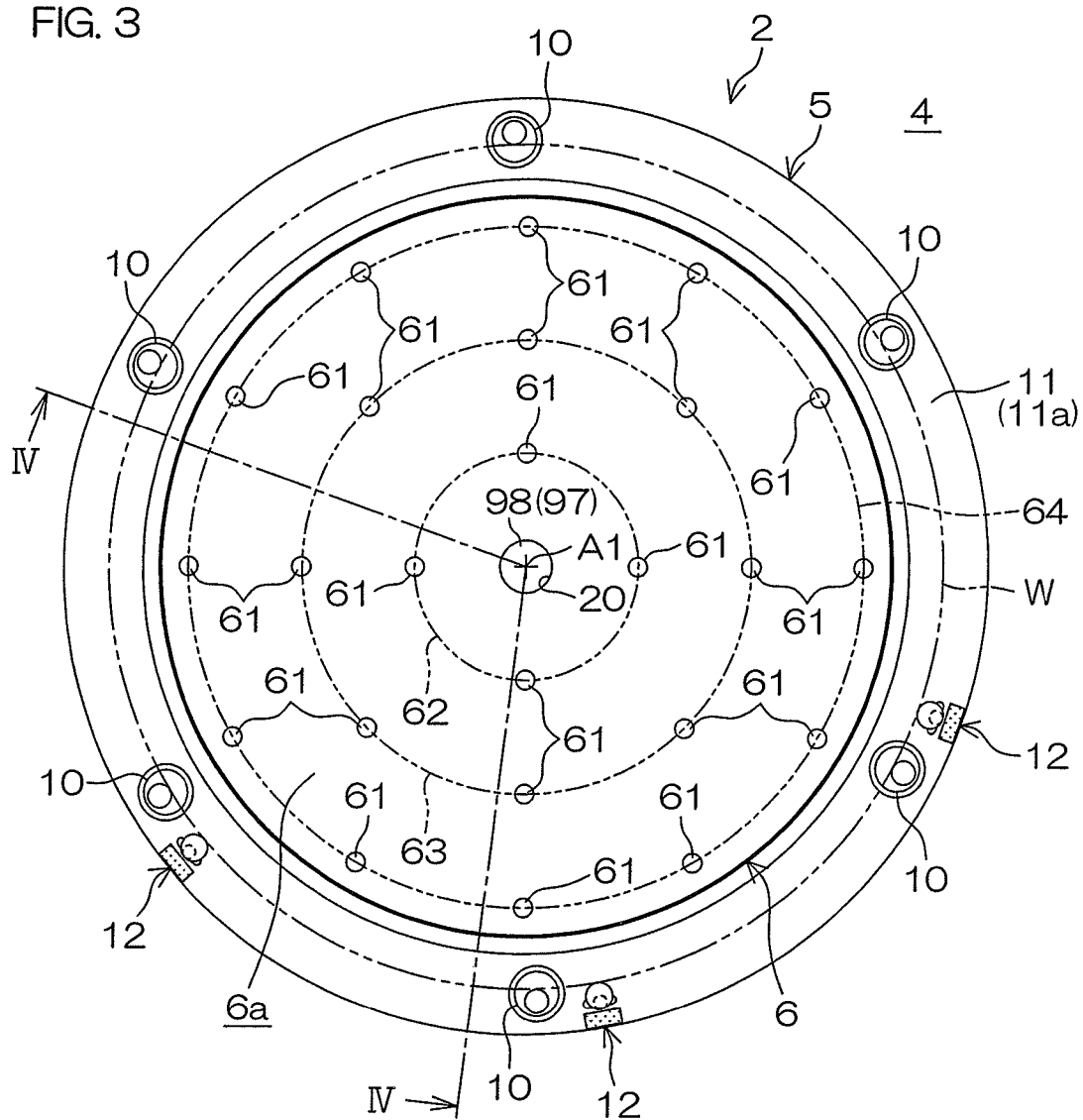
FIG. 3 is a plan view of a substrate holding and rotating unit and a hot plate shown in FIG. 2.
Figure 4:
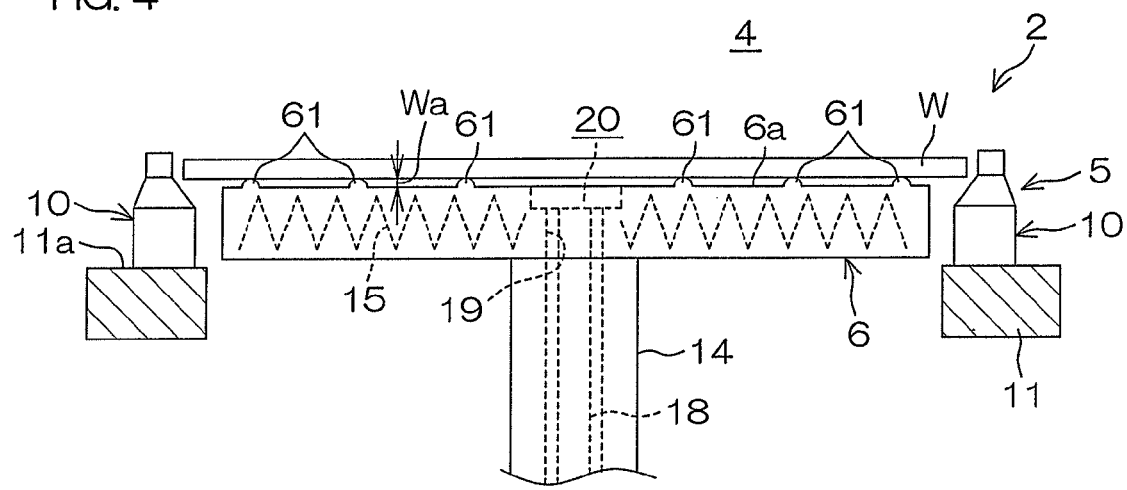
FIG. 4 is a sectional view taken along a sectional plane IV-IV in FIG. 3.
Figure 5:
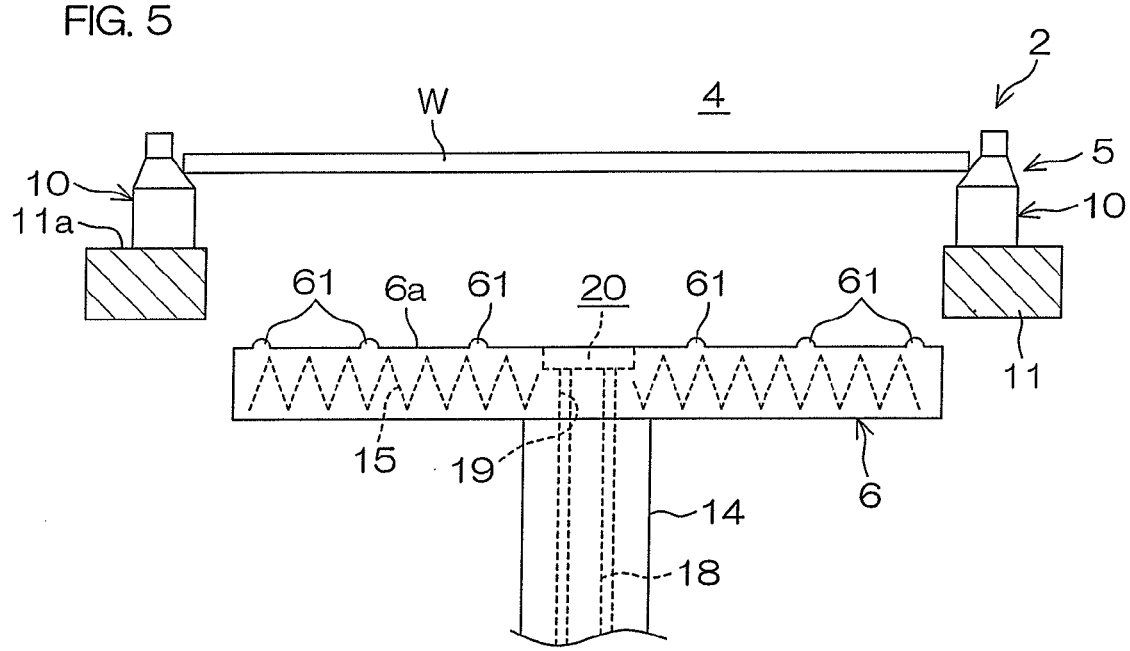
FIG. 5 is a sectional view taken along the sectional plane IV-IV in FIG. 3.

FIG. 3 is a plan view of the substrate holding and rotating unit 5 and the hot plate 6. FIGS. 4 and 5 are sectional views taken along a sectional plane IV-IV in FIG. 3. FIG. 4 illustrates a state observed when the hot plate 6 is located at an upper position, and FIG. 5 illustrates a state observed when the hot plate 6 is located at a lower position (retracted position).

As shown in FIGS. 2 to 5, the substrate holding and rotating unit 5 includes an annular rotation ring 11 having a slightly greater outer diameter than the substrate W. The rotation ring 11 is made of a resin material having a chemical resistance, and has a rotation center concentric with the rotation axis A1 of the substrate W. The rotation ring 11 has an annular upper surface 11a which is horizontal and flat. A plurality of fixed pins 10 (e.g., six fixed pins) immovable with respect to the rotation ring 11 and a plurality of movable pins 12 (e.g., three movable pins) which are smaller in number than the fixed pins 10 and movable with respect to the rotation ring 11 are provided on the upper surface 11a.

The plural fixed pins 10 are circumferentially equidistantly arranged on the upper surface 11a of the rotation ring 11. The plural movable pins 12 are circumferentially arranged on the upper surface 11a of the rotation ring 11. The movable pins 12 are provided in one-to-one correspondence with the same number of fixed pins 10 (e.g., three fixed pins 10) disposed adjacent to the movable pins 12. The movable pins 12 are disposed adjacent to the corresponding fixed pins 10. That is, the movable pins 12 are disposed locally circumferentially of the rotation ring 11.

A ring rotating unit 13 for rotating the rotation ring 11 about the rotation axis A1 is connected to the rotation ring 11. The ring rotating unit 13 includes, for example, a motor, an associated transmission mechanism and the like.

As shown in FIGS. 2 to 5, the hot plate 6 is made of, for example, a ceramic material or silicon carbide (SiC), and has a disk shape. The hot plate 6 has a round flat substrate opposing surface 6a having a slightly smaller diameter than the substrate W. The substrate opposing surface 6a has a diameter smaller than the inner diameter of the rotation ring 11. That is, the hot plate 6 and the rotation ring 11 of the substrate holding and rotating unit 5 do not vertically overlap with each other. The hot plate 6 incorporates a heater 15 of, for example, a resistor type. The heater 15 is energized to generate heat to heat the entire hot plate 6 including the substrate opposing surface 6a. A round protection liquid outlet port 20 is provided in the substrate opposing surface 6a on the rotation axis A1.

As shown in FIG. 3, a multiplicity of minute embosses 61 (e.g., 24 embosses in FIG. 3) each having a generally hemispherical shape for supporting the substrate W from below in abutment against the substrate W are distributed on the substrate opposing surface 6a of the hot plate 6. The embosses 61 are arranged at a generally uniform density throughout the substrate opposing surface 6a. More specifically, four embosses 61 are equidistantly arranged on a first phantom circle 62 defined about the rotation axis A1. Eight embosses 61 are equidistantly arranged on a second phantom circle 63 concentric with the first phantom circle 62. Twelve embosses 61 are equidistantly arranged on a third phantom circle 64 concentric with the first phantom circle 62. The second and third phantom circles 63, 64 respectively have diameters that are about twice and about three times the diameter of the first phantom circle 62. The multiple embosses 61 have substantially the same diameter. The embosses 61 each have a height such that the substrate W supported by the multiple embosses 61 can be prevented from adhering to the substrate opposing surface 6a.

As shown in FIG. 4, the substrate W is spaced a minute distance Wa from the substrate opposing surface 6a above the substrate opposing surface 6a with the lower surface thereof in abutment against the multiple embosses 61. The substrate W is supported on the hot plate 6 by a frictional force occurring between the multiple embosses 61 and the lower surface of the substrate W and, when the heater 15 generates heat in this state, the substrate opposing surface 6a also generates heat. The heat is applied to the substrate W through heat transfer by heat radiation, heat conduction through a fluid present in a space defined between the substrate opposing surface 6a and the substrate W, and heat conduction via the multiple embosses 61. Thus, the substrate W supported by the multiple embosses 61 is heated.

Since the substrate W is supported by the multiple embosses 61 distributed on the substrate opposing surface 6a, the heat transfer from the substrate opposing surface 6a to the substrate W can be kept uniform within the plane of the substrate W. Further, this suppresses or prevents warpage of the substrate W.

The multiple embosses 61 may be provided only on a peripheral portion of the substrate opposing surface 6a rather than on the entire substrate opposing surface 6a.

The embosses 61 may be separate members from the hot plate 6, or may be unitary with the hot plate 6. Alternatively, the hot plate 6 may be configured such that the substrate W is placed directly on the substrate opposing surface 6a without the provision of the embosses 61 on the substrate opposing surface 6a.

As shown in FIGS. 2, 4 and 5, a vertical plate support shaft 14 is fixed to the hot plate 6 from below.

The plate support shaft 14 extends vertically. The plate support shaft 14 is a hollow shaft, and a power supply line (not shown) for power supply to the heater 15 and the protection liquid pipe 18 are inserted through the inside of the plate support shaft 14.

The plate lift unit 8 is connected to the plate support shaft 14. The plate lift unit 8 includes, for example, a ball screw and a motor. The plate support shaft 14 is moved up and down by driving the plate lift unit 8, whereby the hot plate 6 is moved up and down between a lower position (indicated in FIG. 5) at which the hot plate 6 is significantly retracted downward below the lower surface of the substrate W held by the substrate holding and rotating unit 5 and an upper position (indicated in FIG. 4) at which the hot plate 6 is located slightly below the lower surface of the substrate W held by the substrate holding and rotating unit 5. With the hotplate 6 being located at the upper position, the substrate W is disengaged from the fixed pins 10, and supported by the hot plate 6. As described above, the hot plate 6 and the rotation ring 11 of the substrate holding and rotating unit 5 do not vertically overlap with each other. Therefore, the hot plate 6 and the substrate holding and rotating unit 5 do not interfere with each other during the up and down movement of the hot plate 6.

The protection liquid pipe 18 communicates with the protection liquid outlet port 20 opening in a center portion of the substrate opposing surface 6a through a through-hole 19 which extends thicknesswise through a center portion of the hot plate 6. The protection liquid is supplied to the protection liquid pipe 18 via the protection liquid valve 21. The protection liquid is, for example, pure water (deionized water). The protection liquid is not limited to the pure water, but may be carbonated water, electrolytic ion water, hydrogen water, ozone water or a hydrochloric acid aqueous solution having a dilute concentration (e.g., about 10 to about 100 ppm).

Figure 6:
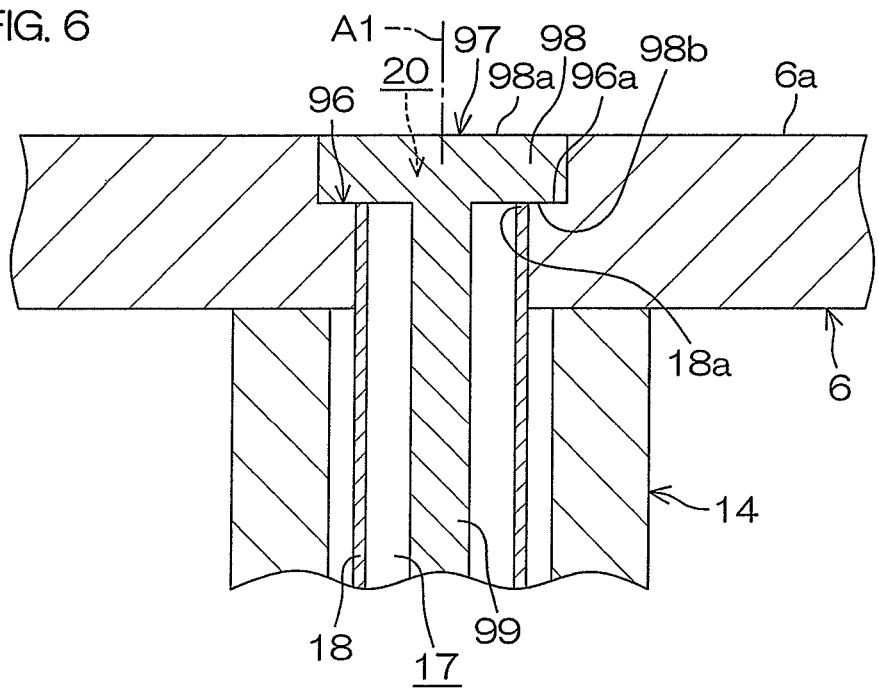
FIG. 6 is a sectional view showing major portions of the hot plate and a plate support shaft of FIG. 2 on an enlarged scale.
Figure 7:
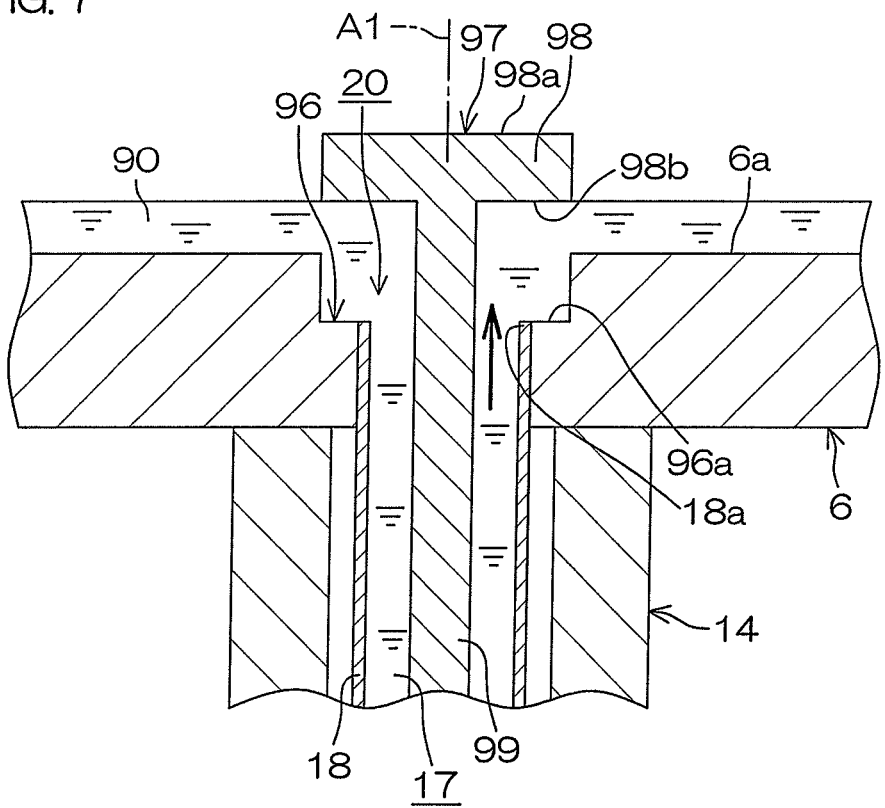
FIG. 7 is a sectional view showing the major portions of the hot plate and the plate support shaft of FIG. 2 on an enlarged scale.

FIGS. 6 and 7 are sectional views showing major portions of the hot plate 6 and the plate support shaft 14 on an enlarged scale.

The protection liquid outlet port 20 is defined by a shallow round recess 96 having a round shape as seen vertically. The round recess 96 has a hollow cylindrical shape defined about the rotation axis A1, and has a diameter greater than the outer diameter of the protection liquid pipe 18. The protection liquid pipe 18 has an upper end 18a which opens in a horizontal lower bottom surface 96a of the round recess 96. The protection liquid outlet port 20 is dimensioned just so as to accommodate a closing portion (closing member) 98 of an elevation member 97 to be described later. In an ordinary state, the protection liquid outlet port 20 is closed by the elevation member 97 inserted in the protection liquid pipe 18.

The elevation member 97 integrally includes a disk-shaped closing portion 98 and a linear insertion portion 99 extending from the center of the closing portion 98 perpendicularly to the closing portion 98, and is provided in a distal portion of the protection liquid pipe 18. The elevation member 97 is made of, for example, a ceramic material or silicon carbide (SiC). The closing portion 98 has a diameter greater than the outer diameter of the protection liquid pipe 18. The closing portion 98 has a flat upper surface 98a and a flat lower surface 98b which are parallel to each other.

The elevation member 97 is provided in the protection liquid pipe 18 with the insertion portion 99 thereof inserted in the protection liquid pipe 18 (i.e., in the protection liquid flow passage 17). In this state, the elevation member 97 is vertically movable with respect to the protection liquid pipe 18 and the protection liquid flow passage 17.

The supply of the protection liquid to the protection liquid flow passage 17 is switched on and off by opening and closing the protection liquid valve 21 (see FIG. 2). With the protection liquid valve 21 being open, the protection liquid is supplied to the protection liquid flow passage 17 to flow through the protection liquid flow passage 17. With the protection liquid valve 21 being closed, on the other hand, the protection liquid is not newly supplied to the protection liquid flow passage 17 and, therefore, does not flow through the protection liquid flow passage 17.

When the protection liquid does not flow through the protection liquid flow passage 17, as shown in FIG. 6, the closing portion 98 of the elevation member 97 is accommodated in the protection liquid outlet port 20 to substantially completely close the protection liquid outlet port 20. At this time, the elevation member 97 is located at a closing position (indicated in FIG. 6). With the elevation member 97 located at the closing position, the insertion portion 99 of the elevation member 97 extends vertically along the rotation axis A1, and the upper surface 98a of the closing portion 98 is flush with the substrate opposing surface 6a.

When the protection liquid flows through the protection liquid flow passage 17, on the other hand, the lower surface 98b of the closing portion 98 receives a pressure from the protection liquid flowing through the protection liquid flow passage 17, whereby the elevation member 97 is elevated as shown in FIG. 7. As a result, the elevation member 97 is elevated to be located at the elevated position (indicated in FIG. 7) above the substrate opposing surface 6a. In order to prevent the elevation member 97 from being further elevated above the elevated position, an engagement portion (not shown) of the closing portion 98 is brought into engagement with a peripheral member (not shown) with the elevation member 97 being located at the elevated position.

In this state, the lower surface 98b of the closing portion 98 guides the protection liquid spouted from the protection liquid outlet port 20 toward an outer peripheral portion of the hot plate 6. Thus, formation of a liquid film 90 of the protection liquid on the substrate opposing surface 6a is promoted as shown in FIG. 7.

As shown in FIG. 2, the treatment liquid supplying unit 7 includes a chemical liquid nozzle 26 which spouts the chemical liquid, and a rinse nozzle 27 which spouts the rinse liquid. The chemical liquid nozzle 26 and the rinse liquid nozzle 27 are attached to a distal end of a generally horizontally extending arm 29 with their spouts directed downward. The arm 29 is pivotal about a predetermined rotation axis. The chemical liquid nozzle 26 and the rinse liquid nozzle 27 are juxtaposed in pivoting directions in which the arm 29 is pivoted. An arm pivoting unit 30 which pivots the arm 29 within a predetermined angular range is connected to the arm 29. By pivoting the arm 29, the chemical liquid nozzle 26 and the rinse liquid nozzle 27 are moved between a home position defined outside the cup 9 and a position above a center portion of the substrate W held by the substrate holding and rotating unit 5 or the hot plate 6.

As shown in FIG. 2, the chemical liquid nozzle 26 is, for example, a straight nozzle which spouts the chemical liquid downward in the form of continuous stream. A chemical liquid line 31 through which the chemical liquid is supplied from a chemical liquid supply source is connected to the chemical liquid nozzle 26. A chemical liquid valve 32 which opens and closes the chemical liquid line 31 to switch on and off the supply of the chemical liquid is provided in the chemical liquid line 31. With the chemical liquid valve 32 being open, the chemical liquid is supplied from the chemical liquid line 31 to the chemical liquid nozzle 26. With the chemical liquid valve 32 being closed, the supply of the chemical liquid from the chemical liquid line 31 to the chemical liquid nozzle 26 is stopped. The chemical liquid may be a liquid containing at least one of sulfuric acid, acetic acid, nitric acid, hydrochloric acid, hydrofluoric acid, ammonia water, hydrogen peroxide water, organic acids (e.g., citric acid, oxalic acid and the like), organic alkalis (e.g., TMAH: tetramethylammonium hydroxide and the like), surfactant and an anti-corrosion agent.

As shown in FIG. 2, the rinse liquid nozzle 27 is, for example, a straight nozzle which spouts the rinse liquid downward in the form of continuous stream. A rinse liquid line 33 through which the rinse liquid is supplied from a rinse liquid supply source is connected to the rinse liquid nozzle 27. A rinse liquid valve 34 which opens and closes the rinse liquid line 33 to switch on and off the supply of the rinse liquid is provided in the rinse liquid line 33. With the rinse liquid valve 34 being open, the rinse liquid is supplied from the rinse liquid line 33 to the rinse liquid nozzle 27. With the rinse liquid valve 34 being closed, the supply of the rinse liquid from the rinse liquid line 33 to the rinse liquid nozzle 27 is stopped.

In FIG. 2, the chemical liquid nozzle 26 and the rinse liquid nozzle 27 are provided on the single arm 29, but may be respectively provided on different arms 29.

As shown in FIG. 2, the cup 9 includes a lower cup portion 37 which accommodates the substrate holding and rotating unit 5 and the hot plate 6, and a lid member 39 which closes an opening 38 of the lower cup portion 37. With the opening 38 of the lower cup portion 37 being closed by the lid member 39, a sealed cup having a sealed space defined therein is provided.

The lower cup portion 37 has a generally cylindrical container-like shape, and has a round top opening 38. The lower cup portion 37 integrally includes a generally disk-shaped bottom wall 40 and a peripheral wall 41 extending upright from the bottom wall 40. The peripheral wall 41 has a hollow cylindrical shape defined about the rotation axis A1. The peripheral wall 41 has an annular upper end surface 41a. One of opposite ends of a waste liquid passage (not shown) is connected to an upper surface of the bottom wall 40. The other end of the waste liquid passage is connected to an external waste liquid facility (not shown).

A capture cup (not shown) for capturing a treatment liquid scattered from the substrate W held by the substrate holding and rotating unit 5 or the hot plate 6 is provided around the peripheral wall 41. The capture cup is connected to the external waste liquid facility not shown. A gap between the plate support shaft 14 and the bottom wall 40 is sealed with an annular seal member 43.

The lid member 39 is provided in a generally horizontal attitude above the lower cup portion 37. A lid lift unit 54 is connected to the lid member 39. The lid lift unit 54 includes, for example, a ball screw and a motor. By driving the lid lift unit 54, the lid member 39 is moved up and down between a lid closing position at which the lid member 39 closes the opening 38 of the lower cup portion 37 and a lid opening position at which the lid member 39 is retracted above the lower cup portion 37 to open the opening 38 of the lower cup portion 37. An upper annular recess 39b having a hollow cylindrical shape coaxial with the lid member 39 is provided in a region of the lower surface of the lid member 39 between a center portion 39a and a peripheral portion 39c.

The center portion 39a of the lower surface of the lid member 39 has a round horizontal flat surface. The center portion 39a of the lower surface of the lid member 39 is opposed to the center portion of the upper surface of the substrate W held by the substrate holding and rotating unit 5 or the center portion of the upper surface of the substrate W held by the hot plate 6.

A seal ring 53 is provided on the peripheral portion 39c of the lower surface of the lid member 39 as extending along the entire circumference. The seal ring 53 is made of, for example, an elastic resin material. With the lid member 39 located at the lid closing position, the seal ring 53 provided on the peripheral portion 39c of the lower surface of the lid member 39 abuts against the upper end surface 41a of the lower cup portion 37 along the entire circumference to seal a gap between the lid member 39 and the lower cup portion 37.

As shown in FIG. 2, an upper rinse liquid line 44, an upper organic solvent line 45 and an upper nitrogen gas line 46 vertically extend in adjacent relation to be inserted through the center portion 39a of the lid member 39.

A lower end of the upper rinse liquid line 44 opens in the center portion 39a of the lower surface of the lid member 39 to define a rinse liquid outlet port 47. An upper end of the upper rinse liquid line 44 is connected to the rinse liquid supply source. The rinse liquid is supplied to the upper rinse liquid line 44 from the rinse liquid supply source. An upper rinse liquid valve 48 which opens and closes the upper rinse liquid line 44 to switch on and off the supply of the rinse liquid is provided in the upper rinse liquid line 44.

A lower end of the upper organic solvent line 45 opens in the center portion 39a of the lower surface of the lid member 39 to define an organic solvent outlet port 49. An upper end of the upper organic solvent line 45 is connected to an organic solvent supply source. Liquid IPA (an exemplary organic solvent (second treatment liquid)) is supplied to the upper organic solvent line 45 from an IPA supply source. An organic solvent valve 50 which opens and closes the upper organic solvent line 45 to switch on and off the supply of the liquid IPA is provided in the upper organic solvent line 45. The upper organic solvent line 45 and the organic solvent valve 50 constitute an organic solvent supplying unit (second treatment liquid supplying unit).

A lower end of the upper nitrogen gas line 46 opens in the center portion 39a of the lower surface of the lid member 39 to define a nitrogen gas outlet port 51 through which nitrogen gas ($N_2$) is spouted as an exemplary inert gas. An upper end of the upper nitrogen gas line 46 is connected to a nitrogen gas supply source. The nitrogen gas is supplied from the nitrogen gas supply source to the nitrogen gas outlet port 51 through the upper nitrogen gas line 46 which serves as a nitrogen gas supply passage. A nitrogen gas valve 52 which opens and closes the upper nitrogen gas line 46 to switch on and off the supply of the nitrogen gas is provided in the upper nitrogen gas line 46.

Figure 8:
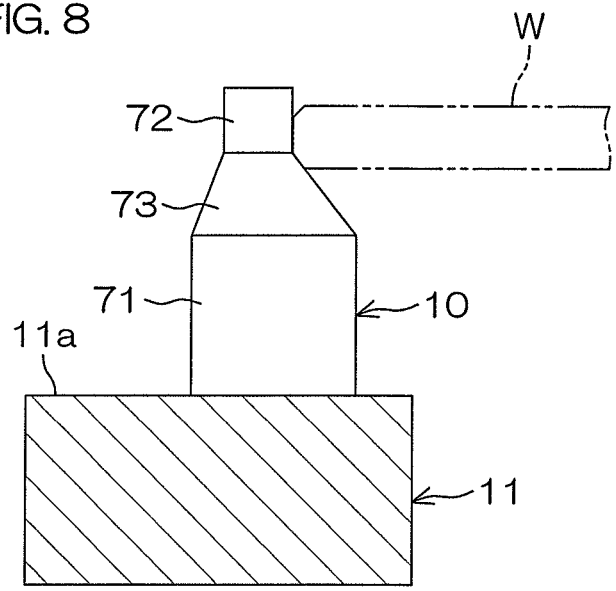
FIG. 8 is a sectional view schematically showing the structure of a fixed pin.

FIG. 8 is a sectional view schematically showing the structure of the fixed pin 10. As described with reference to FIG. 3, the plural fixed pins 10 are circumferentially equidistantly arranged on the upper surface 11a of the rotation ring 11. As illustrated in FIG. 8, the fixed pins 10 each include a first lower shaft portion 71 connected to the rotation ring 11, and a first upper shaft portion 72 integrally provided on an upper end of the first lower shaft portion 71. The first lower shaft portion 71 and the first upper shaft portion 72 each have a cylindrical shape. The first upper shaft portion 72 is eccentric from the center axis of the first lower shaft portion 71. A portion of the first lower shaft portion 71 connected to the first upper shaft portion 72 has a tapered surface 73 having a diameter progressively increased toward a lower side.

Figure 9:
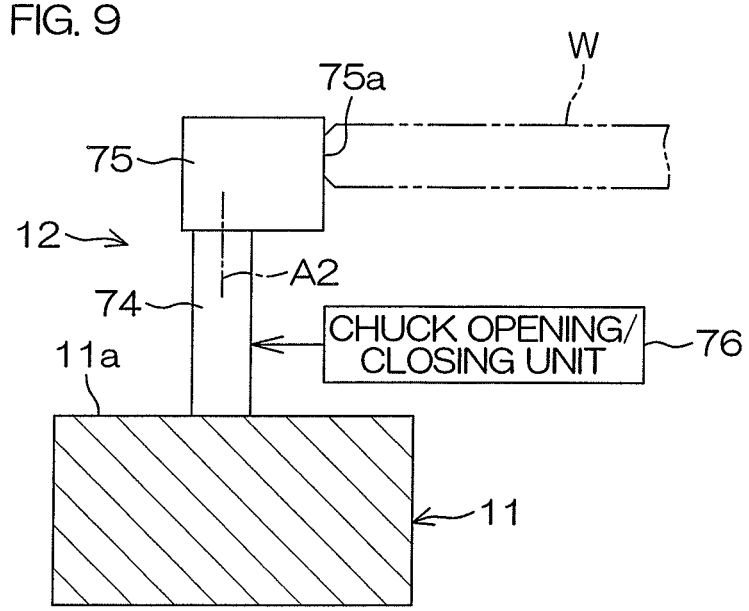
FIG. 9 is a sectional view schematically showing the structure of a movable pin.

FIG. 9 is a sectional view schematically showing the movable pin 12 and an arrangement around the movable pin 12. The movable pins 12 each include a second lower shaft portion 74 extending vertically and connected to the rotation ring 11 so as to be rotatable about a rotation axis A2, and a second upper shaft portion 75 fixed to the second lower shaft portion 74 with its center axis being eccentric from the rotation axis A2. The second upper shaft portion 75 has a cylindrical surface 75a to be brought into abutment against a peripheral edge of the substrate W. By the rotation of the second lower shaft portion 74, the cylindrical surface 75a of the second upper shaft portion 75 is shifted between an unclamping position at which the cylindrical surface 75a is located away from the rotation axis A1 (see FIG. 2) of the substrate W and a clamping position at which the cylindrical surface 75a is located closer to the rotation axis A1. The movable pins 12 each include a chuck opening/closing unit 76. The chuck opening/closing unit 76 shifts the second upper shaft portion 75 between the unclamping position and the clamping position to clamp and unclamp the substrate W.

As shown in FIGS. 8 and 9, the peripheral edge of the substrate W abuts against the tapered surfaces 73 of the respective fixed pins 10 with the substrate W supported from below by the plural fixed pins 10. In this state, the second upper shaft portions 75 of the respective movable pins 12 are each shifted from the unclamping position to the clamping position. When the second upper shaft portions 75 are each shifted from the unclamping position to the clamping position, the cylindrical surfaces 75a are brought into abutment against the peripheral edge of the substrate W, and press the abutting peripheral edge portions of the substrate W inward of the substrate W. Thus, peripheral edge portions of the substrate W opposite from the abutting peripheral edge portions of the substrate W with respect to the rotation axis A1 are brought into abutment against the first upper shaft portions 72 of the fixed pins 10 located opposite from the movable pins 12 with respect to the rotation axis A1. By thus shifting the second upper shaft portions 75 of the respective movable pins 12 from the unclamping positions to the clamping positions, the movable pins 12 are brought into a clamping state. Thus, the substrate W is horizontally clamped by the fixed pins 10 and the movable pins 12.

The cylindrical surfaces 75a may be each formed with a V-shaped groove, which horizontally opens toward the rotation axis A1. In this case, the cylindrical surfaces 75a are not pressed against the peripheral edge of the substrate W, but upper and lower tapered surfaces of the V-shaped grooves are brought into abutment against the peripheral edge of the substrate W to clamp the substrate W.

The controller 3 shown in FIG. 1 includes, for example, a microcomputer. The controller 3 controls the operations of the plate lift unit 8, the ring rotating unit 13, the arm pivoting unit 30, the lid lift unit 54, the chuck opening/closing unit 76 and the like according to predetermined programs. Further, the controller 3 controls electric power to be supplied to the heater 15. In addition, the controller 3 controls the opening and closing of the protection liquid valve 21, the chemical liquid valve 32, the rinse liquid valve 34, the upper rinse liquid valve 48, the organic solvent valve 50, the nitrogen gas valve 52 and the like.

FIG. 10 is a sectional view showing the front surface of the substrate W to be treated by the treatment unit 2 on an enlarged scale. The substrate W to be treated is, for example, a silicon wafer, and includes a minute pattern 101 provided on the front surface (upper surface 100) which is a pattern formation surface. The minute pattern 101 may include projecting (columnar) structures 102 arranged in a matrix array as shown in FIG. 10. In this case, the structures 102 of the minute pattern 101 each have a line width W1 of, for example, about 10 nm to about 45 nm, and are arranged with a gap W2 of, for example, about 10 nm to several micrometers.

The minute pattern 101 may include linear structures arranged in a repeated pattern defined by minute trenches.

Alternatively, the minute pattern 101 may be formed by forming a plurality of minute holes (voids or pores) in a thin film.

The minute pattern 101 includes, for example, an insulation film. The minute pattern 101 may include an electrically conductive film. More specifically, the minute pattern 101 may be formed of a layered film including a plurality of films stacked one on another, and may include an insulation film and an electrically conductive film. Alternatively, the minute pattern 101 may be a pattern formed of a single-layer film. The insulation film may be a silicon oxide film ($SiO_2$ film) or a silicon nitride film (SiN film). The electrically conductive film may be an amorphous silicon film doped with an impurity for reduction of resistance, or may be a metal film (e.g., a metal interconnection film).

The minute pattern 101 has a thickness T of, for example, about 50 nm to about 5 μm. The minute pattern 101 may have an aspect ratio (a ratio of the thickness T to the line width W1) of, for example, about 5 to about 500 (typically about 5 to about 50).

Figure 12A:
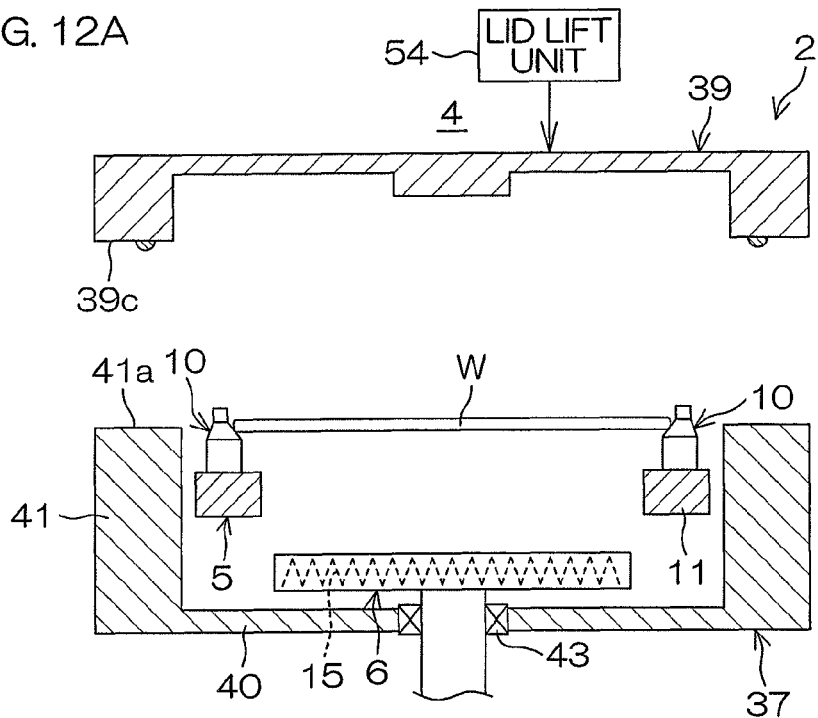
FIGS. 12A to 12H are schematic diagrams for explaining the exemplary process of FIG. 11.

FIG. 11 is a process diagram for explaining an exemplary chemical liquid treatment process to be performed by the treatment unit 2. FIGS. 12A to 12H are schematic diagrams for explaining the exemplary process. FIGS. 13A and 13B are schematic sectional views for explaining a state of the upper surface of the substrate W observed in the exemplary process.

Reference will hereinafter be made to FIGS. 1, 2, 6 and 7. Reference will be also made to FIGS. 4, 5 and 10 to 13B as required. In the following description, "the front surface (upper surface) of the substrate W" includes the front surface (upper surface) of the substrate W itself as well as the front surface (upper surface) of the minute pattern 101.

When the substrate treatment is to be performed by the treatment unit 2, a substrate loading step (Step S1 in FIG. 11) is performed to load an untreated substrate W into the chamber 4. Prior to the substrate loading step (S1), the controller 3 turns on the heater 15 (into an energized state), and locates the hot plate 6 at the lower position (indicated in FIG. 5) at which the hot plate 6 is retracted significantly downward from the substrate holding position at which the substrate W is held by the substrate holding and rotating unit 5. Further, the controller 3 retracts all the nozzles from above the substrate holding and rotating unit 5. The controller 3 brings all the movable pins 12 into the unclamping state. In the substrate loading step (S1), the controller 3 causes the substrate transport robot CR (see FIG. 1) to insert its hands into the chamber 4 with the substrate W held by the hands, and to transfer the substrate W to the substrate holding and rotating unit 5 with the pattern formation surface (front surface) facing up. The substrate W transferred to the substrate holding and rotating unit 5 is supported by the plural fixed pins 10 from below. Then, the controller 3 brings the plural movable pins 12 into the clamping state. Thus, as shown in FIG. 12A, the substrate W is horizontally clamped by the plural fixed pins 10 (e.g., six fixed pins 10) and the plural movable pins 12 (e.g., three movable pins 12) (in FIG. 12A, only the fixed pins 10 are shown). The controller 3 causes the substrate transport robot CR to retract its hands from the chamber 4 after transferring the substrate W to the substrate holding and rotating unit 5.

After the substrate W is clamped by the plural fixed pins 10 and the plural movable pins 12, the controller 3 controls the ring rotating unit 13 to start rotating the substrate W. The rotation speed of the substrate W is increased to a predetermined liquid treatment rotation speed (e.g., about 100 to 1500 rpm) and maintained at the liquid treatment rotation speed.

Although the heater 15 is turned on in the substrate loading step (S1) and, hence, the hot plate 6 is kept in the heat generating state (at this time, the substrate opposing surface 6a has a surface temperature of, for example, about 60° C. to about 250° C.), the heat generated by the hot plate 6 located at the lower position does not sufficiently reach the substrate W.

In turn, a chemical liquid supplying step (Step S2 in FIG. 11) is performed to supply the chemical liquid to the substrate W.

Figure 12B:
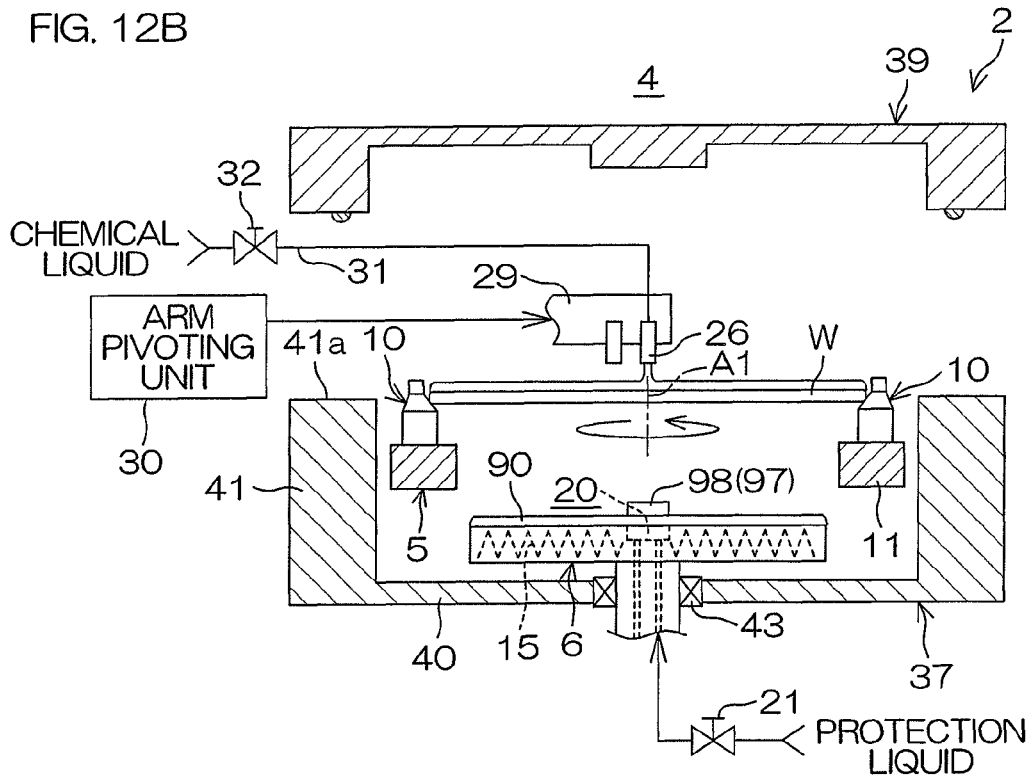
Figure 13A:
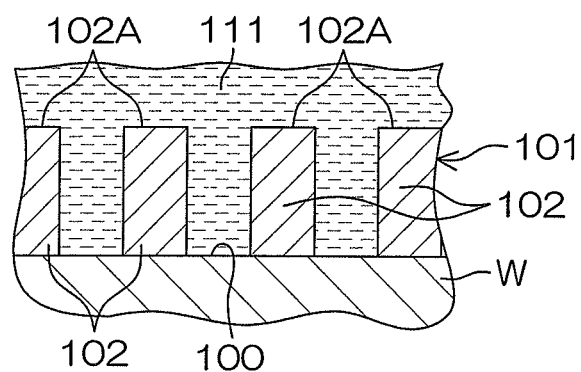
FIGS. 13A and 13B are schematic sectional views for explaining the state of an upper surface of the substrate in the exemplary process of FIG. 11.
Figure 13B:
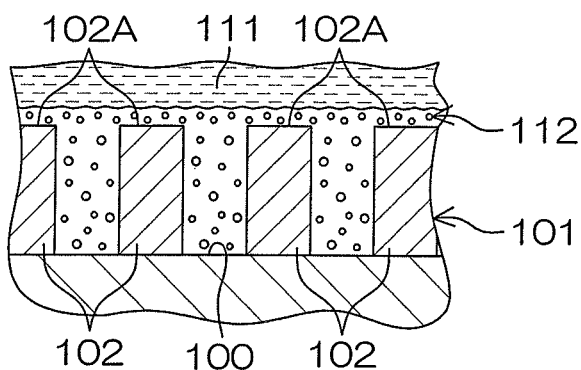

More specifically, as shown in FIG. 12B, the controller 3 controls the arm pivoting unit 30 to pivot the arm 29 from the home position to move the chemical liquid nozzle 26 from the retracted position to the position above the substrate W. Thus, the chemical liquid nozzle 26 is located at the treatment position (on the rotation axis A1 of the substrate W above the substrate W). After the chemical liquid nozzle 26 is located at the treatment position, the controller 3 opens the chemical liquid valve 32. Thus, the chemical liquid is spouted from the spout of the chemical liquid nozzle 26 to be supplied onto the upper surface of the substrate W.

The chemical liquid supplied to the center portion of the upper surface of the substrate W receives a centrifugal force generated by the rotation of the substrate W to flow toward the peripheral portion of the substrate W on the upper surface of the substrate W. Thus, the chemical liquid is supplied to the entire upper surface of the substrate W, whereby the entire upper surface of the substrate W is treated with the chemical liquid. The chemical liquid supplied to the upper surface of the substrate W is scattered from the peripheral portion of the substrate W laterally of the substrate W. Liquid droplets of the chemical liquid expelled from the substrate W held by the substrate holding and rotating unit 5 fall downward.

The chemical liquid scattered from the peripheral portion of the substrate W is received by an inner wall of the capture cup described above to be sent to the external waste liquid facility (not shown) through the waste liquid passage (not shown), and treated in the waste liquid facility. The scattered liquid may be sent to a recovery facility, rather than to the waste liquid facility, for recycling.

In synchronism with the start of the spouting of the chemical liquid from the chemical liquid nozzle 26, the controller 3 opens the protection liquid valve 21. Thus, the protection liquid supplied to the protection liquid flow passage 17 flows through the protection liquid flow passage 17. Therefore, the closing portion 98 receives a pressure from the flowing protection liquid. As a result, the elevation member 97 is elevated from the closing position (indicated in FIG. 6) to the elevated position (indicated in FIG. 7).

Thus, the protection liquid outlet port 20 is opened, whereby the protection liquid supplied to the protection liquid flow passage 17 is spouted from the protection liquid outlet port 20. At this time, the flow rate of the protection liquid is a relatively great flow rate (e.g., about 0.5 to about 4.0 (liter/minute)). The protection liquid spouted from the protection liquid outlet port 20 to the substrate opposing surface 6a is forced to flow radially outward toward the peripheral portion of the substrate opposing surface 6a by the subsequently supplied protection liquid. At this time, the protection liquid spouted from the protection liquid outlet port 20 to the substrate opposing surface 6a is smoothly guided toward the peripheral portion of the substrate opposing surface 6a by the closing portion 98 of the elevation member 97 located at the elevated position. As a result, as shown in FIG. 12B, the liquid film 90 of the protection liquid is formed on the substrate opposing surface 6a as covering the entire substrate opposing surface 6a. After the formation of the protection liquid film 90, the protection liquid is continuously supplied from the protection liquid outlet port 20 to the substrate opposing surface 6a, whereby the protection liquid film 90 formed on the substrate opposing surface 6a is kept covering the substrate opposing surface 6a.

After a lapse of a predetermined period from the start of the spouting of the chemical liquid, the controller 3 closes the chemical liquid valve 32 to stop spouting the chemical liquid from the chemical liquid nozzle 26.

Subsequently, a rinsing step (Step S3 in FIG. 11) is performed to remove the chemical liquid from the substrate W.

Figure 12C:
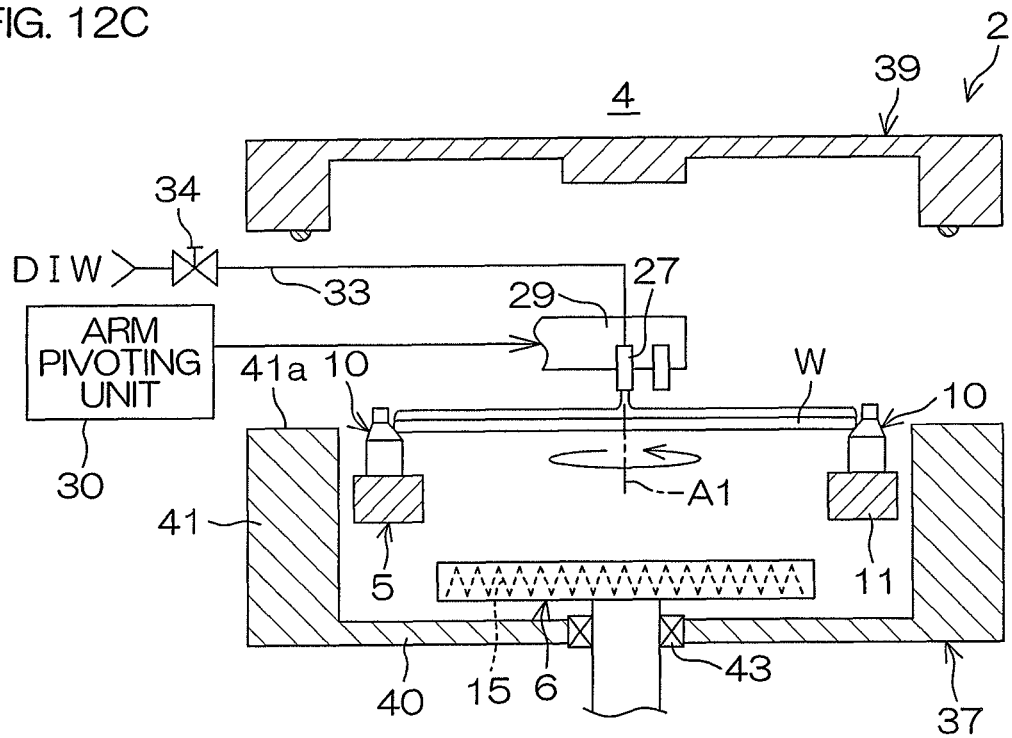

More specifically, as shown in FIG. 12C, the controller 3 controls the arm pivoting unit 30 to pivot the arm 29 to locate the rinse liquid nozzle 27 at the treatment position. After the rinse liquid nozzle 27 is locate at the treatment position, the controller 3 opens the rinse liquid valve 34. Thus, the rinse liquid is spouted from the spout of the rinse liquid nozzle 27.

The rinse liquid supplied to the center portion of the upper surface of the substrate W receives the centrifugal force generated by the rotation of the substrate W to flow toward the peripheral portion of the substrate W on the upper surface of the substrate W. Thus, the rinse liquid is supplied to the entire upper surface of the substrate W to rinse away the chemical liquid from the upper surface of the substrate W. The rinse liquid supplied to the upper surface of the substrate W is scattered from the peripheral portion of the substrate W laterally of the substrate W.

The rinse liquid scattered from the peripheral portion of the substrate W is received by an inner wall of the peripheral wall 41 of the lower cup portion 37, and flows on the inner wall to be retained in the bottom of the lower cup portion 37. The rinse liquid retained in the bottom of the lower cup portion 37 is sent to the external waste liquid facility (not shown) through the waste liquid passage (not shown), and treated in the waste liquid facility.

After a lapse of a predetermined period from the start of the spouting of the rinse liquid, the controller 3 closes the rinse liquid valve 34 to stop spouting the rinse liquid from the rinse liquid nozzle 27, and controls the arm pivoting unit 30 to move the arm 29 back to its home position. Thus, the chemical liquid nozzle 26 and the rinse liquid nozzle 27 are returned to the retracted position.

In synchronism with the stop of the spouting of the rinse liquid, the controller 3 closes the protection liquid valve 21 to stop supplying the protection liquid to the protection liquid flow passage 17. Thus, the spouting of the protection liquid from the protection liquid outlet port 20 is stopped, so that the protection liquid film 90 is no longer retained on the substrate opposing surface 6a (a liquid film retention state is eliminated). As the supply of the protection liquid to the protection liquid flow passage 17 is stopped, the elevation member 97 is moved down to the closing position (see FIG. 6). The supply of the protection liquid is not necessarily required to be stopped in synchronism with the stop of the supply of the rinse liquid, but may be stopped at any time after the chemical liquid on the upper surface of the substrate W is replaced with the rinse liquid.

Subsequently, the controller 3 controls the lid lift unit 54 to move down the lid member 39 to the lid closing position. The opening 38 of the lower cup portion 37 is closed by the lid member 39 thus moved down to the lid closing position. When the lid member 39 and the lower cup portion 37 are connected to each other by a lock member (not shown) in this state, the seal ring 53 provided on the peripheral portion 39c of the lower surface of the lid member 39 abuts against the upper end surface 41a of the peripheral wall 41 of the lower cup portion 37 along the entire circumference, whereby the gap between the lower cup portion 37 and the lid member 39 is sealed. Thus, an inner space defined by the lower cup portion 37 and the lid member 39 is sealed. In this state, the rinse liquid outlet port 47, the organic solvent outlet port 49 and the nitrogen gas outlet port 51 are opposed to the upper surface of the substrate W.

Then, a final rinsing step (Step S4 in FIG. 11) is performed on the substrate W.

Figure 12D:
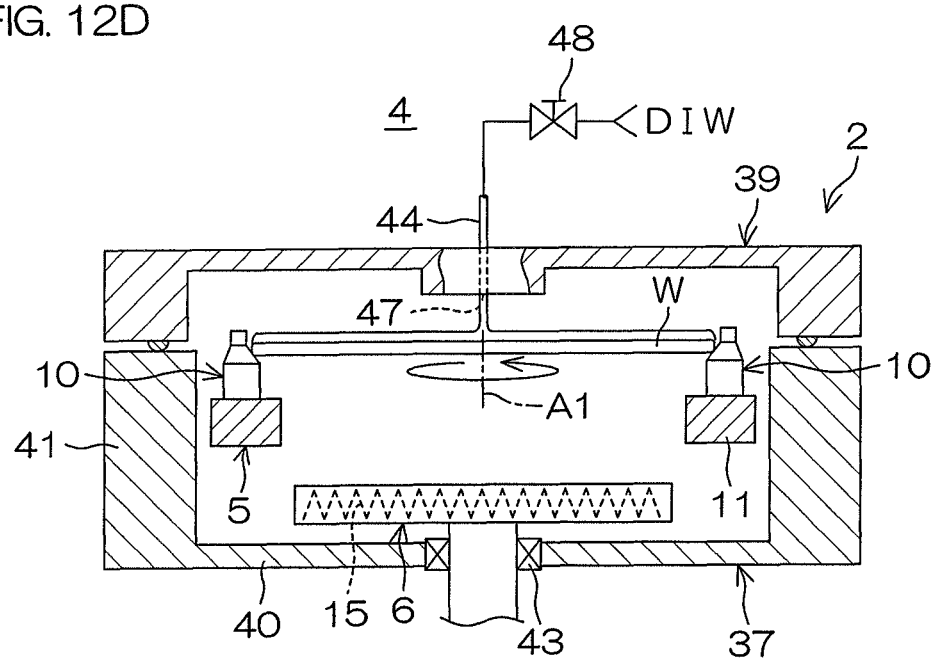

More specifically, as shown in FIG. 12D, the controller 3 opens the upper rinse liquid valve 48 to spout the rinse liquid from the rinse liquid outlet port 47 of the upper rinse liquid line 44. The rinse liquid spouted from the rinse liquid outlet port 47 is applied to the center portion of the upper surface of the substrate W.

The rinse liquid supplied to the center portion of the upper surface of the substrate W receives the centrifugal force generated by the rotation of the substrate W to flow toward the peripheral portion of the substrate W on the upper surface of the substrate W. Thus, the rinse liquid is supplied to the entire upper surface of the substrate W, whereby the upper surface of the substrate W is rinsed with the rinse liquid. In the final rinsing step (S4), the rinse liquid is distributed to bottom portions of gaps of the minute pattern 101 (see FIG. 10) formed on the upper surface 100 (see FIG. 10) of the substrate W (to portions of the gaps that are very close to the upper surface 100 of the substrate W itself).

The rinse liquid scattered from the peripheral portion of the substrate W is received by the inner wall of the peripheral wall 41 of the lower cup portion 37, and flows on the inner wall to be retained in the bottom of the lower cup portion 37. The rinse liquid retained in the bottom of the lower cup portion 37 is sent to the external waste liquid facility (not shown) through the waste liquid passage (not shown), and treated in the waste liquid facility.

After a lapse of a predetermined period from the start of the spouting of the rinse liquid, the controller 3 closes the upper rinse liquid valve 48 to stop spouting the rinse liquid from the rinse liquid outlet port 47.

Subsequently, an organic solvent replacing step (Step S5 in FIG. 11) is performed to replace the rinse liquid with the liquid IPA on the upper surface of the substrate W by supplying the liquid IPA to the upper surface of the substrate W.

Figure 12E:
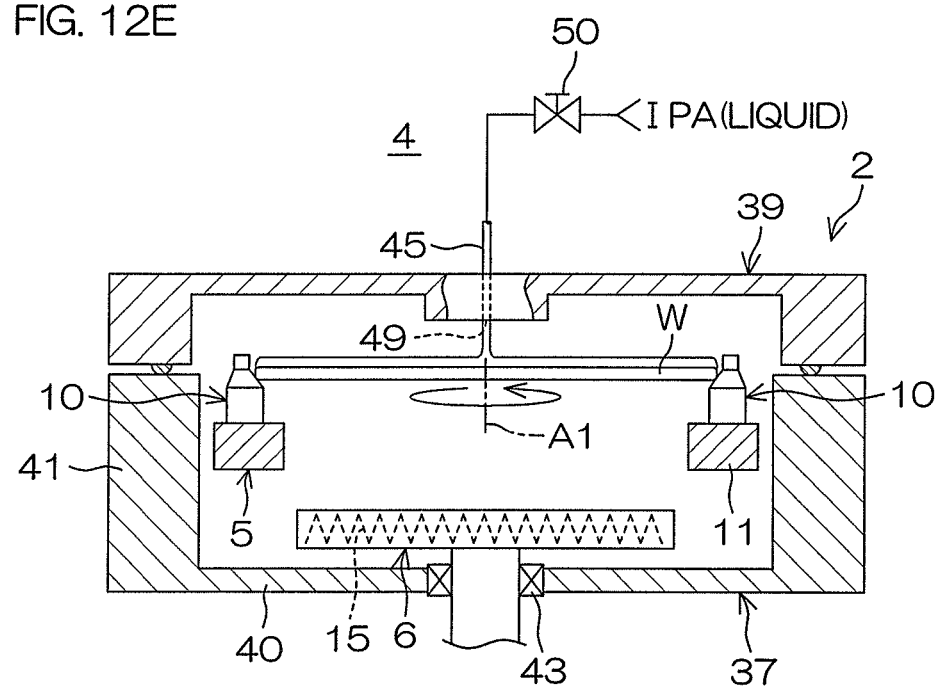

As shown in FIG. 12E, the controller 3 opens the organic solvent valve 50 to spout the liquid IPA in the form of continuous stream from the organic solvent outlet port 49 of the upper organic solvent line 45. The IPA spouted from the organic solvent outlet port 49 is in a liquid form at an ordinary temperature (e.g., 25° C.), i.e., has a liquid temperature lower than the boiling point of the IPA (82.4° C.). The liquid IPA spouted from the organic solvent outlet port 49 is applied to the center portion of the upper surface of the substrate W. The organic solvent replacing step (S5) is started by the start of the spouting of the IPA.

The liquid IPA supplied to the center portion of the upper surface of the substrate W receives the centrifugal force generated by the rotation of the substrate W, and flows toward the peripheral portion of the substrate W on the upper surface of the substrate W. Therefore, the liquid IPA supplied to the center portion of the upper surface of the substrate W can spread toward the peripheral portion to be thereby distributed to the entire upper surface of the substrate W. At this time, the hot plate 6 is located at the lower position, so that the heat from the hot plate 6 is not sufficiently transferred to the substrate W. Therefore, the upper surface of the substrate W is maintained, for example, at an ordinary temperature, so that the IPA flows on the upper surface of the substrate W while being maintained at the ordinary temperature. Thus, a liquid film of the IPA is formed on the upper surface of the substrate W. Since the IPA supplied to the upper surface of the substrate W is in a liquid form, the rinse liquid present in the gaps of the minute pattern 101 can be properly replaced with the IPA as shown in FIG. 13A. The IPA liquid film 111 covers the entire upper surface of the substrate W, so that the rinse liquid can be properly replaced with the liquid IPA on the entire upper surface of the substrate W.

In the organic solvent replacing step (S5), the rotation of the substrate W may be stopped, or the substrate W may be rotated at a puddling speed. As the rotation speed of the substrate W is reduced, the centrifugal force acting on the liquid IPA on the substrate W becomes zero or is reduced. Therefore, the liquid IPA is not expelled from the peripheral portion of the substrate W but retained on the upper surface of the substrate W. As a result, the IPA liquid film is retained in a puddle-like state on the upper surface of the substrate W.

After a lapse of a predetermined period from the start of the supply of the IPA, a substrate transferring step (Step S6 in FIG. 11) is performed.

Figure 12F:
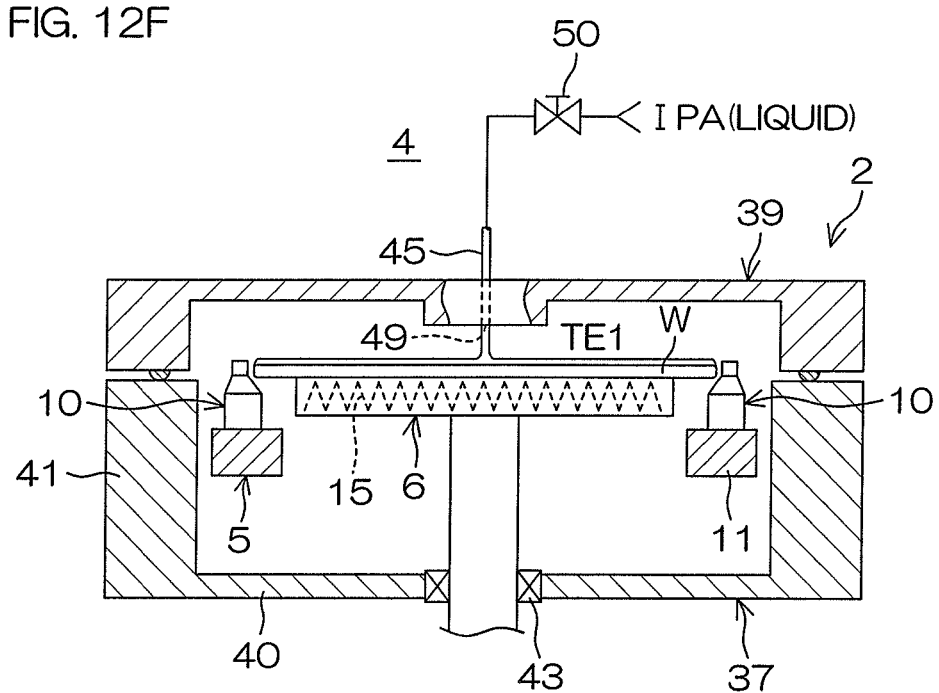

More specifically, the controller 3 controls the plate lift unit 8 to move up the hot plate 6 from the lower position (indicated in FIG. 5) to the upper position (indicated in FIG. 4). When the hot plate 6 is moved up to the same height as the rotation ring 11, the substrate opposing surface 6a of the hot plate 6 is brought into abutment against the lower surface of the substrate W. Thereafter, the controller 3 continuously moves up the hot plate 6, whereby the substrate W is disengaged from the substrate holding and rotating unit 5 to be transferred to the hot plate 6. The substrate W transferred to the hot plate 6 is supported from below by the multiple embosses 61. Even after the transfer of the substrate W, the hot plate 6 is continuously moved up. When the hot plate 6 reaches the upper position, the upward movement of the hot plate 6 is stopped. A state of the hot plate 6 located at the upper position is shown in FIGS. 12F and 4.

After the substrate W is transferred to the hot plate 6, a substrate temperature increasing step (substrate heating step, Step S7 in FIG. 11) is started.

Since the heater 15 is constantly energized, the hot plate 6 (substrate opposing surface 6a) is kept in the heat generating state. With the substrate W placed on the hotplate 6, the heat from the substrate opposing surface 6a is applied to the lower surface of the substrate W by the heat radiation, the heat conduction through the fluid present in the space defined between the substrate opposing surface 6a and the substrate W, and the heat conduction via the multiple embosses 61. Thus, the lower surface of the substrate W is heated. The amount of the heat to be applied to a unit area of the substrate W is substantially uniform throughout the substrate W.

In this state, the protection liquid does not flow through the protection liquid flow passage 17, so that the elevation member 97 is located at the closing position (see FIG. 4). Therefore, the upper surface 98a of the closing portion 98 is flush with the substrate opposing surface 6a of the hot plate 6. Therefore, the substrate W placed on the hot plate 6 can be properly supported in contact with the entire substrate opposing surface 6a of the hot plate 6. Further, the entire substrate W can be properly heated.

In the substrate temperature increasing step (S7), the temperature of the upper surface of the substrate W is increased to a predetermined liquid film levitation temperature (first temperature) TE1 which is higher by 40° C. to 120° C. than the boiling point of the IPA (82.4° C.) by heating the substrate W with the use of the hot plate 6. The liquid film levitation temperature TE1 is set to a predetermined temperature.

After the temperature of the upper surface of the substrate W reaches the liquid film levitation temperature TE1, the temperature of the upper surface of the substrate W (the temperature of the upper surface of the minute pattern 101 (see FIG. 13B), more specifically, the temperatures of the upper end surfaces 102A of the respective structures 102) is maintained at the liquid film levitation temperature TE1. The entire upper surface of the substrate W is maintained at the liquid film levitation temperature TE1. At this time, the amount of the heat generated per unit period by the heater 15 is set so that the upper surface of the substrate W placed on the hot plate 6 is maintained at the liquid film levitation temperature TE1 by the heating with the hot plate 6.

Shortly after the temperature of the upper surface of the substrate W reaches the liquid film levitation temperature TE1, a part of the IPA liquid film 111 on the upper surface of the substrate W evaporates, whereby the gaps of the minute pattern 101 are filled with the resulting IPA vapor, and an IPA vapor film 112 is formed above the upper surface of the substrate W (above the upper end surfaces 102A of the respective structures 102). Thus, the IPA liquid film 111 is levitated from the upper surface of the substrate W (from the upper end surfaces 102A of the respective structures 102) (see FIG. 13B). Further, the gaps of the minute pattern 101 are filled with the IPA vapor. Therefore, only a very small surface tension occurs between the adjacent structures 102. As a result, collapse of the minute pattern 101 can be suppressed or prevented which may otherwise occur due to the surface tension. Since the IPA liquid film 111 is levitated from the upper surface of the substrate W (from the upper end surfaces 102A of the respective structures 102) as shown in FIG. 13B, the magnitude of a frictional force occurring between the upper surface of the substrate W and the IPA liquid film 111 is generally zero.

After the substrate temperature increasing step (S7), an organic solvent removing step (Step S8 in FIG. 11) is performed to remove the IPA liquid film 111 in the form of liquid mass above the IPA vapor film 112. In the organic solvent removing step (S8), a force is applied to the IPA liquid film 111 to move the IPA liquid film 111 laterally of the substrate W.

Figure 12G:
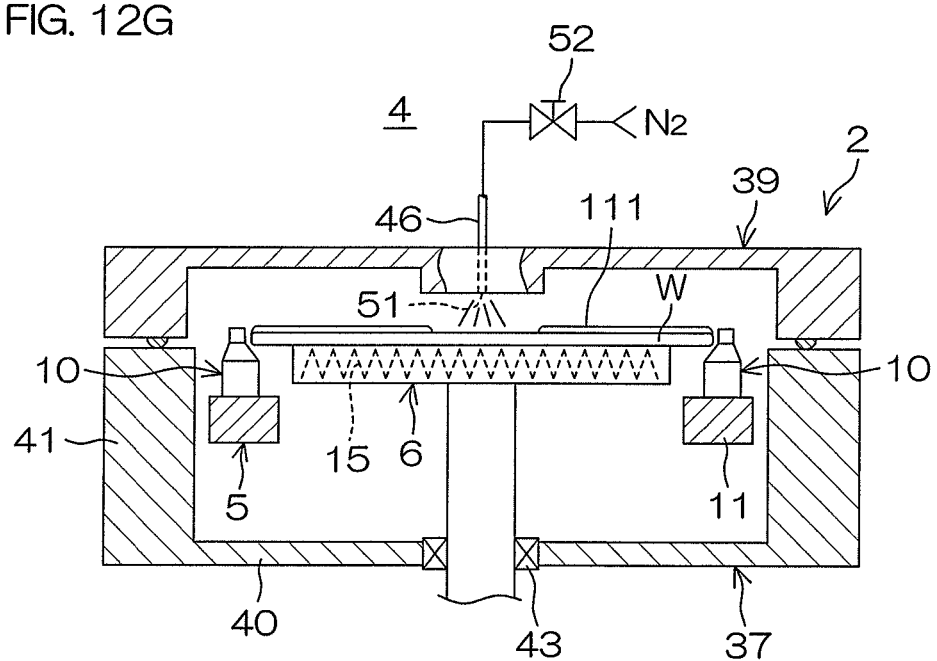

More specifically, as shown in FIG. 12G, the controller 3 opens the nitrogen gas valve 52 after a lapse of a predetermined period (e.g., about 1 to 2 minutes) from the time at which the substrate W is transferred to the hot plate 6. Thus, the nitrogen gas is spouted from the nitrogen gas outlet port 51 to be sprayed to the center portion of the upper surface of the substrate W, whereby a smaller-diameter dry region 113 is formed in the center portion of the levitated IPA liquid film 111. The magnitude of the frictional force occurring between the upper surface of the substrate W and the IPA liquid film 111 is generally zero. Therefore, the dry region 113 is expanded, as the nitrogen gas is continuously spouted from the nitrogen gas outlet port 51. The dry region 113 spreads over the entire upper surface of the substrate W, whereby the levitated IPA liquid film 111 is guided laterally of the substrate W in the form of liquid mass (without disintegration into a multiplicity of droplets). Thus, the IPA liquid film 111 can be completely removed from above the substrate W.

After the IPA liquid film 111 is completely removed from above the substrate W, the controller 3 controls the plate lift unit 8 to move down the hot plate 6 from the upper position (indicated in FIG. 4) to the lower position (indicated in FIG. 5). When the hot plate 6 is moved down to the same height as the rotation ring 11, the fixed pins 10 are brought into abutment against the peripheral surface of the substrate W. Thereafter, the substrate W is disengaged from the hot plate 6 by the downward movement of the hot plate 6, whereby the substrate W is transferred to the substrate holding and rotating unit 5. The substrate W transferred to the substrate holding and rotating unit 5 is supported by the plural fixed pins 10 from below. The movable pins 12 are in the unclamping state, so that the substrate W is not clamped by the fixed pins 10 and the movable pins 12.

Figure 12H:
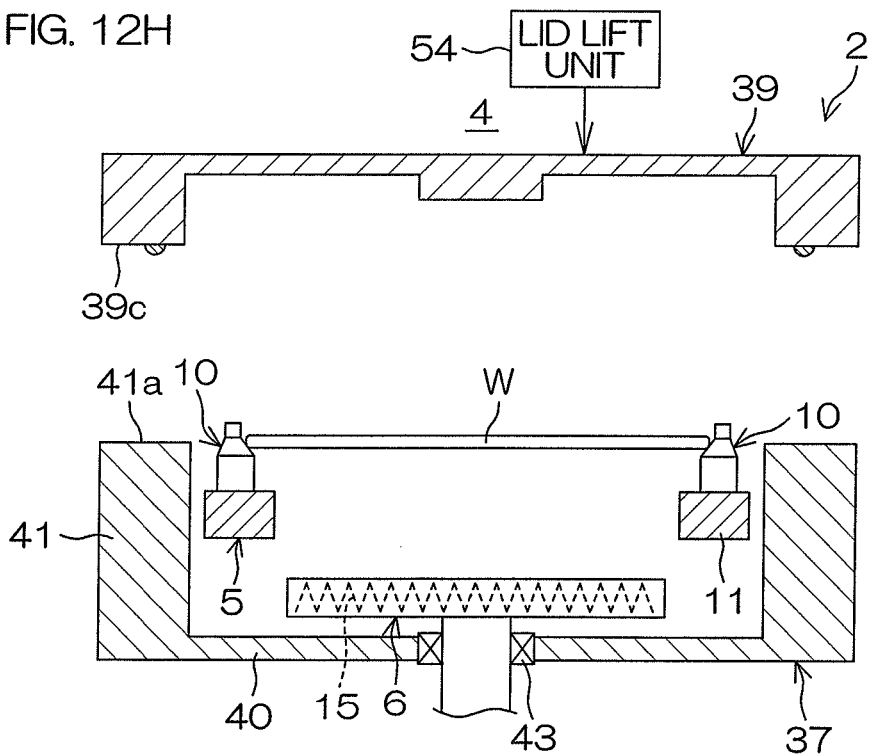

The controller 3 drives the lock member (not shown) to disengage the lid member 39 and the lower cup portion 37 from each other. Then, as shown in FIG. 12H, the controller 3 controls the lid lift unit 54 to move up the lid member 39 to the opening position.

After the hot plate 6 is moved down to the lower position, the distance between the hot plate 6 and the substrate W held by the substrate holding and rotating unit 5 is increased as compared with the distance observed when the hot plate 6 is located at the upper position. Therefore, the heat from the hot plate 6 does not sufficiently reach the substrate W (by the heat radiation, the heat conduction through the fluid present in the space defined between the substrate opposing surface 6a and the substrate W, and the heat conduction via the multiple embosses 61). Thus, the heating of the substrate W by the hot plate 6 ends, whereby the temperature of the substrate W is reduced substantially to the ordinary temperature.

In this manner, the chemical liquid treatment of the single substrate W is completed, and the substrate transfer robot CR performs a substrate unloading step (Step S9 in FIG. 11) to unload the treated substrate W from the chamber 4.

As described above, the protection liquid is continuously supplied to the substrate opposing surface 6a of the hot plate 6 in the chemical liquid supplying step (S2) and the rinsing step (S3), whereby the protection liquid film 90 is formed on the substrate opposing surface 6a of the hot plate 6 as covering the substrate opposing surface 6a. In the chemical liquid supplying step (S2) and the rinsing step (S3), the hot plate 6 is retracted from the substrate holding and rotating unit 5. Therefore, liquid droplets of the chemical liquid and the chemical liquid-containing rinse liquid expelled from the substrate W held by the substrate holding and rotating unit 5 are liable to fall over the substrate opposing surface 6a and the multiple embosses 61 of the hot plate 6. If these liquid droplets were supplied directly to the substrate opposing surface 6a and the embosses 61 and heated by the hot plate 6 energized in the heat generating state, the chemical liquid would be heated to be dried on the substrate opposing surface 6a and the embosses 61. Since the embosses 61 of the hot plate 6 are brought into contact with the substrate W in the substrate temperature increasing step (S7), the substrate W would be contaminated with particles of the dried chemical liquid.

Even in this case, however, the substrate opposing surface 6a is covered with the protection liquid film 90, so that the liquid droplets of the chemical liquid and the chemical liquid-containing rinse liquid from the substrate W are not supplied directly to the substrate opposing surface 6a. Therefore, the chemical liquid is reliably prevented from being dried on the substrate opposing surface 6a energized in the heat generating state. This prevents the generation of particles which may otherwise occur when the chemical liquid is dried on the hot plate 6.

When the protection liquid is not spouted from the protection liquid outlet port 20, the protection liquid does not flow through the protection liquid flow passage 17. At this time, the closing portion 98 closes the protection liquid outlet port 20. When the protection liquid is spouted from the protection liquid outlet port 20, on the other hand, the protection liquid flows through the protection liquid flow passage 17. Therefore, the closing portion 98 receives the pressure from the flowing protection liquid to be elevated above the substrate opposing surface 6a of the hot plate 6. In this state, the protection liquid spouted from the protection liquid outlet port 20 is guided toward the outer peripheral portion of the hot plate 6 by the closing portion 98. This promotes the formation of the protection liquid film 90 on the substrate opposing surface 6a.

With this simple arrangement, the protection liquid outlet port 20 of the hot plate 6 can be closed when the protection liquid is not to be spouted from the protection liquid outlet port 20, and the protection liquid film 90 can be properly formed on the substrate opposing surface 6a of the hot plate 6 when the protection liquid is spouted from the protection liquid outlet port 20. In this case, there is no need to separately provide a drive member for moving up and down the closing portion 98.

When the protection liquid is not spouted from the protection liquid outlet port 20, the upper surface 98a of the closing portion 98 is flush with the substrate opposing surface 6a of the hot plate 6. Therefore, the substrate W placed on the hot plate 6 can be properly supported in contact with the entire substrate opposing surface 6a of the hot plate 6, and the entire substrate W can be properly heated.

In the exemplary process described above, the final rinsing step (S4) is performed while sealing the inner space defined by the lower cup portion 37 and the lid member 39 by way of example. Alternatively, the final rinsing step (S4) may be performed while opening the inner space defined by the lower cup portion 37 and the lid member 39 (with the lid member 39 being located at the opening position). In the final rinsing step (S4), the rinse liquid from the rinse liquid outlet port 47 of the upper rinse liquid line 44 may be supplied to the upper surface of the substrate W, or the rinse liquid from the rinse liquid nozzle 27 may be supplied to the upper surface of the substrate W with the rinse liquid nozzle 27 being opposed to the upper surface of the substrate W. In this case, the inner space defined by the lower cup portion 37 and the lid member 39 is sealed after the final rinsing step (S4).

In the exemplary process described above, the chemical liquid supplying step (S2) is performed once by way of example, but may be repeated a plurality of times (twice).

In the chemical liquid supplying step (S2) and the rinsing step (S3) of the exemplary process, only the upper surface of the substrate W is treated by way of example, but both the upper and lower surfaces of the substrate W may be treated.

In the exemplary process, the rinsing step (S3) may be obviated.

In the organic solvent removing step (S8) of the exemplary process described above, the nitrogen gas is sprayed toward the center portion of the upper surface of the substrate W from the nitrogen gas outlet port 51 in order to move the IPA liquid film 111 laterally of the substrate W. Alternatively, a guide member (a guide pin or a guide ring) having a guide surface may be provided in opposed relation to the peripheral portion of the substrate and, in the organic solvent removing step (S8), the guide member may be moved inward of the substrate W to bring the levitated IPA liquid film 111 into contact with the guide surface of the guide member. Since the magnitude of the frictional force occurring between the upper surface of the substrate W and the IPA liquid film 111 is generally zero, the levitated IPA liquid film 111 is guided along the guide surface laterally of the substrate W in the form of liquid mass (without disintegration into a multiplicity of liquid droplets) by the contact between the guide surface of the guide member and the IPA liquid film 111. Thus, the IPA liquid film 111 can be completely removed from above the substrate W. Where this arrangement is employed, the substrate W and the hot plate 6 can be each maintained in a horizontal attitude in the organic solvent removing step (S8).

Where the hot plate 6 is adapted to shift its attitude between the horizontal attitude and an inclined attitude, the upper surface of the substrate W may be inclined with respect to the horizontal plane in the organic solvent removing step (S8) by shifting the substrate W and the hot plate 6 into the inclined attitude while maintaining the substrate W and the hot plate 6 in a predetermined attitude relationship. Thus, the levitated IPA liquid film 111 is moved along the upper surface of the substrate W toward a lower peripheral portion of the inclined substrate W by its gravity to be thereby removed from the peripheral portion of the substrate W.

Figure 14:
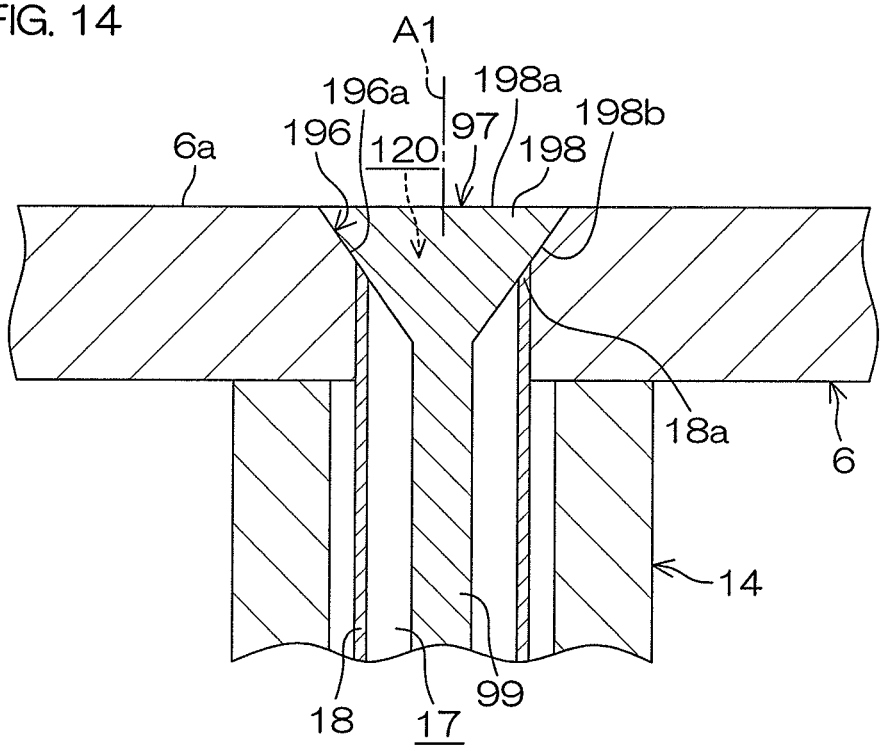
FIGS. 14 and 15 are sectional views showing major portions of the hot plate and the plate support shaft according to a modification on an enlarged scale.
Figure 15:
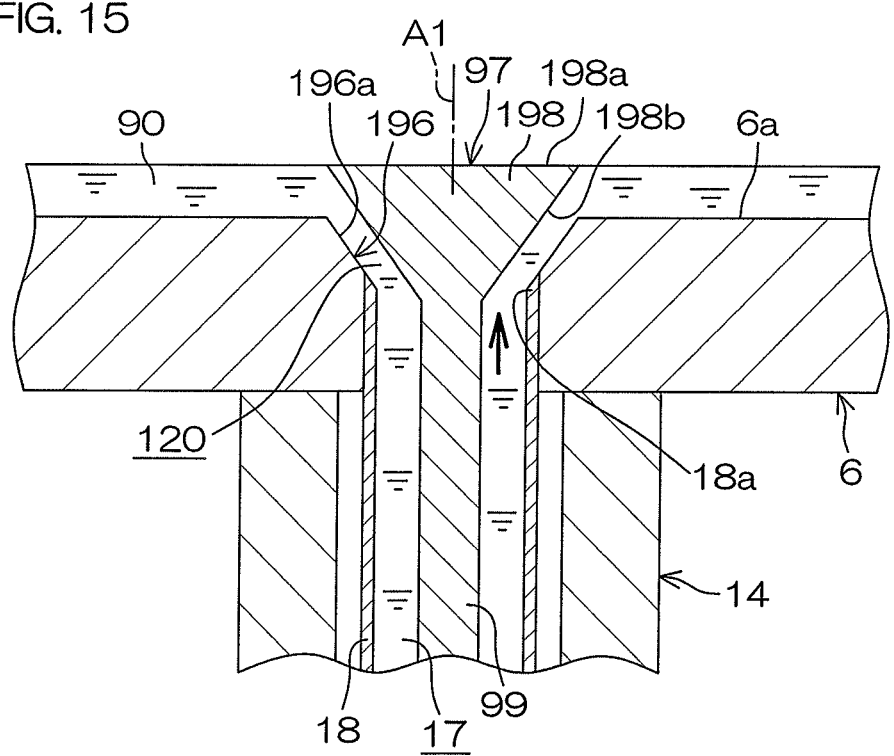

FIGS. 14 and 15 are sectional views showing the major portions of the hot plate 6 and the plate support shaft 14 according to a modification on an enlarged scale. In FIGS. 14 and 15, a protection liquid outlet port 120 defined by a round recess 196 which has a bottom wall having a conical tapered surface 196a is provided instead of the protection liquid outlet port 20. The upper end 18a of the protection liquid pipe 18 opens in the tapered surface 196a. Further, the elevation member 97 includes a conical closing portion (closing member) 198 instead of the closing portion 98. The closing portion 198 includes a bottom wall defined by a tapered surface 198b which conforms to the tapered surface 196a. The protection liquid outlet port 120 is dimensioned and configured just so as to accommodate the closing portion 198.

With the elevation member 97 located at the closing position (indicated in FIG. 14), the closing portion 198 of the elevation member 97 is accommodated in the protection liquid outlet port 120 to substantially completely close the protection liquid outlet port 120. In this state, the upper surface 198a of the closing portion 198 is flush with the substrate opposing surface 6a.

When the protection liquid flows through the protection liquid flow passage 17, on the other hand, the tapered surface 198b of the closing portion 198 receives a pressure from the flowing protection liquid to elevate the elevation member 97 as shown in FIG. 15. As a result, the elevation member 97 is elevated to be located at the elevated position (indicated in FIG. 15) above the substrate opposing surface 6a.

In this state, the tapered surface 198b of the closing portion 198 guides the protection liquid spouted from the protection liquid outlet port 120 toward the outer peripheral portion of the hot plate 6. Since the protection liquid spouted from the protection liquid outlet port 120 is guided by the tapered surface 198b, it is possible to further promote the formation of the protection liquid film 90 on the substrate opposing surface 6a.

Figure 16:
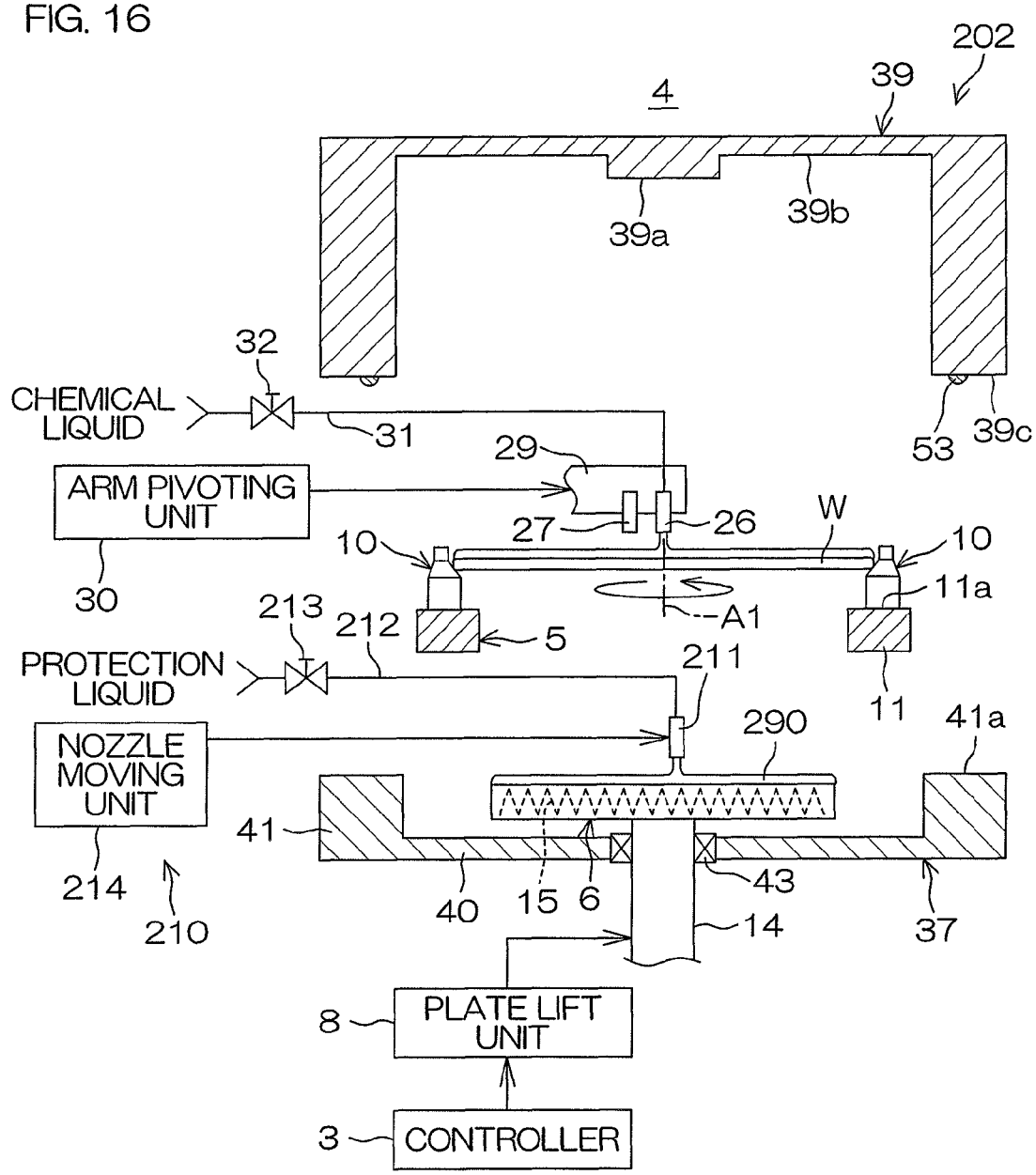
FIG. 16 is a schematic sectional view showing the construction of a substrate treatment apparatus according to another embodiment of the present invention.

FIG. 16 is a schematic sectional view showing the construction of a treatment unit 202 according to another embodiment of the present invention. In FIG. 16, components corresponding to those shown in FIGS. 1 to 15 are designated by the same reference characters as in FIGS. 1 to 15, and duplicate description will be omitted. In FIG. 16, only major portions are shown, and some of the components are not shown.

The embodiment shown in FIG. 16 differs from the embodiment shown in FIGS. 1 to 15 in that a protection liquid supplying unit 210 which supplies the protection liquid to the substrate opposing surface 6a of the hot plate 6 is provided instead of the lower supplying unit 60. The protection liquid spout 20, 120 is not provided in the substrate opposing surface 6a of the hot plate 6.

The protection liquid supplying unit 210 includes a protection liquid nozzle 211 which spouts the protection liquid downward in the form of continuous stream. A protection liquid supply line 212 which supplies the protection liquid from the protection liquid supply source is connected to the protection liquid nozzle 211. A protection liquid valve 213 which opens and closes the protection liquid supply line 212 to switch on and off the supply of the protection liquid is provided in the protection liquid supply line 212. With the protection liquid valve 213 being open, the protection liquid is supplied from the protection liquid supply line 212 to the protection liquid nozzle 211. With the protection liquid valve 213 being closed, the supply of the protection liquid from the protection liquid supply line 212 to the protection liquid nozzle 211 is stopped. A nozzle moving unit 214 is connected to the protection liquid nozzle 211. The nozzle moving unit 214 moves the protection liquid nozzle 211 between a position above the hot plate 6 located at the lower position (indicated in FIG. 16) and a home position defined outside the cup 9. The controller 3 shown in FIG. 1 also controls the operation of the nozzle moving unit 214 according to a predetermined program. The controller 3 controls electric power to be supplied to the heater 15. Further, the controller 3 controls the opening and closing of the protection liquid valve 213.

In the chemical liquid supplying step (S2), the controller 3 controls the nozzle moving unit 214 to locate the protection liquid nozzle 211 above the substrate opposing surface 6a.

Thereafter, the controller 3 opens the protection liquid valve 213. Thus, the protection liquid is spouted from the spout of the protection liquid nozzle 211. At this time, the flow rate of the protection liquid is relatively great (e.g., about 0.5 to about 4.0 (liter/minute). The controller 3 controls the nozzle moving unit 214 to move the protection liquid nozzle 211 along the substrate opposing surface 6a in the plane of the substrate opposing surface 6a while spouting the protection liquid. Thus, the protection liquid applying position is moved within the plane of the substrate opposing surface 6a, whereby a liquid film 290 of the protection liquid is formed on the substrate opposing surface 6a as covering the entire substrate opposing surface 6a. After the formation of the protection liquid film 290, the protection liquid is continuously supplied to the substrate opposing surface 6a from the protection liquid nozzle 211. Thus, the protection liquid film 290 present on the substrate opposing surface 6a is kept covering the substrate opposing surface 6a.

After the chemical liquid on the substrate W is replaced with the rinse liquid, the controller 3 closes the protection liquid valve 213 to stop spouting the protection liquid from the protection liquid nozzle 211. Thus, the protection liquid film 290 is no longer retained on the substrate opposing surface 6a (a liquid film retention state is eliminated).

The protection liquid may be supplied to the substrate opposing surface 6a with the protection liquid nozzle 211 being located still at a predetermined position (e.g., above the center portion of the substrate opposing surface 6a). In this case, the protection liquid spouted from the protection liquid nozzle 211 is forced to flow radially outward toward the peripheral portion of the substrate opposing surface 6a by the subsequently supplied protection liquid. Thus, the protection liquid film 290 is formed on the substrate opposing surface 6a as covering the entire substrate opposing surface 6a. After the formation of the protection liquid film 290, the protection liquid is continuously supplied to the substrate opposing surface 6a from the protection liquid nozzle 211, whereby the protection liquid film 290 on the substrate opposing surface 6a is kept covering the substrate opposing surface 6a.

While two embodiments of the present invention have thus been described, the present invention may be embodied in other ways.

In the embodiment shown in FIGS. 1 to 15, the upper surface 98a, 198a of the closing portion 98, 198 of the elevation member 97 is flush with the substrate opposing surface 6a when the elevation member 97 is located at the closing position (indicated in FIG. 6 or 14) by way of example. However, the upper surface 98a, 198a of the closing portion 98, 198 of the elevation member 97 may be retracted below the substrate opposing surface 6a.

In the embodiment shown in FIGS. 1 to 15, the elevation member 97 receives the pressure from the protection liquid flowing through the protection liquid flow passage 17 to be thereby moved up by way of example. Alternatively, a lift unit such as including a motor or a cylinder may be connected to the elevation member 97, so that the elevation member 97 can be moved up by driving the lift unit.

In the exemplary process described above, the substrate opposing surface 6a is covered with the protection liquid film 90 in the chemical liquid supplying step (S2) by way of example. The substrate opposing surface 6a may be covered with the protection liquid film 90 not only in the chemical liquid supplying step (S2) but also in the rinsing step (S3) and the final rinsing step (S4) in which the treatment liquid such as the chemical liquid, the organic solvent or the rinse liquid is supplied toward the upper surface or the lower surface of the substrate W.

In the exemplary process described above, the chemical liquid supplying step (S2) is performed prior to the substrate temperature increasing step (substrate heating step, S7) by way of example, but may be performed after the substrate heating step.

IPA is used as the organic solvent having a lower surface tension than the rinse liquid by way of example. Other examples of the organic solvent include methanol, ethanol, acetone and HFE (hydrofluoroether).

The substrate W may be treated by using plural types of chemical liquids (two types of chemical liquids) rather than by using the single chemical liquid.

In the embodiments described above, the chemical liquid treatment (an etching treatment, a cleaning treatment or the like) is performed at an atmospheric pressure, but the pressure of the treatment environment is not limited to the atmospheric pressure. For example, the atmosphere of the sealed space defined by the lid member 39 and the lower cup portion 37 may be controlled at an increased or reduced pressure by means of a predetermine pressure controlling unit, whereby the etching treatment, the cleaning treatment or the like according to the embodiments described above may be performed in a higher pressure environment or a lower pressure environment which is controlled at a pressure higher or lower than the atmospheric pressure.

In the embodiments described above, the substrate W is heated with the substrate opposing surface 6a of the hot plate 6 kept in contact with the back surface of the substrate W. The substrate W may be heated by locating the substrate W adjacent to the substrate opposing surface 6a rather than by bringing the substrate W into contact with the substrate opposing surface 6a according to the present invention.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2014-53683 filed in the Japan Patent Office on Mar. 17, 2014, the disclosure of which is incorporated herein by reference in its entirety.

What is claimed is:

1. A substrate treatment method to be performed by a substrate treatment apparatus including a substrate holding unit which holds a substrate, and a hot plate which heats the substrate from below, the substrate treatment method comprising:
    a treatment liquid supplying step of locating the hot plate at a retracted position at which the hot plate is retracted below the substrate holding unit and, in this state, supplying a treatment liquid to an upper surface of the substrate held by the substrate holding unit;
    a protection liquid film forming step of forming a liquid film of a protection liquid on an upper surface of the hot plate to cover the upper surface of the hot plate during the treatment liquid supplying step;
    a substrate heating step of heating the substrate by the hot plate with the hot plate being located adjacent to a lower surface of the substrate or in contact with the lower surface of the substrate,
    wherein the treatment liquid is a liquid containing at least one of sulfuric acid, acetic acid, nitric acid, hydrochloric acid, hydrofluoric acid, ammonia water, hydrogen peroxide water, organic acids, organic alkalis, a surfactant and an anti-corrosion agent, and
    wherein the protection liquid is one of pure water, carbonated water, electrolytic ion water, hydrogen water, ozone water, and a hydrochloric acid aqueous solution.

2. The substrate treatment method according to claim 1, wherein the protection liquid film forming step includes the step of continuously supplying the protection liquid to the upper surface of the hot plate.

3. The substrate treatment method according to claim 1, wherein the protection liquid film forming step includes the step of spouting the protection liquid from a protection liquid outlet port provided in the upper surface of the hot plate.

4. The substrate treatment method according to claim 1, wherein the protection liquid film forming step includes the step of spouting the protection liquid to the upper surface of the hot plate from a protection liquid nozzle.

5. The substrate treatment method according to claim 1, wherein the treatment liquid supplying step includes the steps of supplying a chemical liquid or a rinse liquid to the upper surface of the substrate, and supplying an organic solvent to the upper surface of the substrate to replace the chemical liquid or the rinse liquid with a liquid film of the organic solvent on the upper surface of the substrate,
    wherein the organic solvent liquid film formed on the upper surface of the substrate in the organic solvent supplying step is heated on the upper surface of the substrate in the substrate heating step.

* * * * *